(12) United States Patent
Umeda et al.

(10) Patent No.: US 12,176,219 B2
(45) Date of Patent: Dec. 24, 2024

(54) SEMICONDUCTOR DEVICE FORMING METHOD AND SUBSTRATE PROCESSING APPARATUS

(71) Applicant: SCREEN Holdings Co., Ltd., Kyoto (JP)

(72) Inventors: Eiji Umeda, Kyoto (JP); Masaki Inaba, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 293 days.

(21) Appl. No.: 17/638,879

(22) PCT Filed: Jun. 26, 2020

(86) PCT No.: PCT/JP2020/025291
§ 371 (c)(1),
(2) Date: Feb. 28, 2022

(87) PCT Pub. No.: WO2021/039089
PCT Pub. Date: Mar. 4, 2021

(65) Prior Publication Data
US 2022/0310406 A1 Sep. 29, 2022

(30) Foreign Application Priority Data

Aug. 29, 2019 (JP) .................................. 2019-157007

(51) Int. Cl.
*H01L 21/3213* (2006.01)
*H01L 21/56* (2006.01)

(52) U.S. Cl.
CPC ........ *H01L 21/32134* (2013.01); *H01L 21/56* (2013.01)

(58) Field of Classification Search
None
See application file for complete search history.

(56) References Cited

U.S. PATENT DOCUMENTS 6,190,988 B1 * 2/2001 Furukawa .......... H10B 12/0387
438/389
7,585,727 B2 * 9/2009 Cho .................... H01L 21/3083
438/270

(Continued)

FOREIGN PATENT DOCUMENTS

JP 2005-136097 A 5/2005
JP 2006-278827 A 10/2006

(Continued)

OTHER PUBLICATIONS

International Search Report mailed Sep. 1, 2020 in corresponding PCT International Application No. PCT/JP2020/025291.

(Continued)

*Primary Examiner* — Allan W. Olsen
(74) *Attorney, Agent, or Firm* — OSTROLENK FABER LLP

(57) ABSTRACT

A semiconductor device forming method that includes a step for forming a coating layer and a step for performing etching. In the step for forming a coating layer, the coating layer is formed. The coating layer selectively covers a portion of a recess provided in a stacked structure supported by a base member. The portion of the recess is located on a front surface side of the recess. In the step for performing etching, a deep portion, which is deeper than the coating layer, of the recess is etched with a chemical liquid so as to widen a diameter of the deep portion.

10 Claims, 18 Drawing Sheets

(56) References Cited

U.S. PATENT DOCUMENTS

| | | | |
|---|---|---|---|
| 7,622,394 B2 | 11/2009 | Ikegami | 438/719 |
| 7,858,508 B2 * | 12/2010 | Fujimoto | H01L 29/4236 438/700 |
| 9,082,783 B2 | 7/2015 | Yamawaki et al. | 438/386 |
| 9,337,056 B2 | 5/2016 | Takahashi et al. | |
| 10,600,803 B2 | 3/2020 | Nakanishi et al. | |
| 10,843,223 B2 | 11/2020 | Tanaka et al. | |
| 10,923,352 B2 | 2/2021 | Tiron et al. | |
| 11,020,776 B2 | 6/2021 | Yoshida | |
| 11,101,147 B2 | 8/2021 | Yoshida et al. | |
| 2006/0223324 A1 | 10/2006 | Ikegami | 438/700 |
| 2007/0232042 A1 * | 10/2007 | Cho | H01L 29/4236 438/700 |
| 2008/0102578 A1 * | 5/2008 | Schlosser | H10B 12/09 438/243 |
| 2008/0213968 A1 * | 9/2008 | Lee | H01L 27/0207 438/389 |
| 2012/0049318 A1 * | 3/2012 | Kawamata | H01L 21/3065 257/E21.546 |
| 2012/0273874 A1 * | 11/2012 | Wu | H10B 12/053 438/270 |
| 2013/0146954 A1 * | 6/2013 | Lee | H10B 12/482 257/E27.06 |
| 2014/0291738 A1 * | 10/2014 | Lee | H01L 29/66477 438/296 |
| 2015/0079756 A1 | 3/2015 | Yamawaki et al. | 438/381 |
| 2015/0235862 A1 | 8/2015 | Takahashi et al. | |
| 2016/0163556 A1 | 6/2016 | Briggs et al. | |
| 2018/0345315 A1 | 12/2018 | Tanaka et al. | |
| 2019/0091736 A1 | 3/2019 | Okutani | |
| 2019/0091737 A1 | 3/2019 | Yoshida | |
| 2019/0176179 A1 | 6/2019 | Yoshida et al. | |
| 2019/0198523 A1 | 6/2019 | Nakanishi et al. | |
| 2020/0086360 A1 | 3/2020 | Yoshida et al. | |
| 2020/0212066 A1 | 7/2020 | Nakanishi et al. | |
| 2020/0335327 A1 | 10/2020 | Tiron et al. | |
| 2021/0082954 A1 | 3/2021 | Nakanishi et al. | |
| 2021/0237128 A1 | 8/2021 | Yoshida | |
| 2021/0331192 A1 | 10/2021 | Yoshida et al. | |

FOREIGN PATENT DOCUMENTS

| | | |
|---|---|---|
| JP | 2015-084400 A | 4/2015 |
| JP | 2015-153941 A | 8/2015 |
| JP | 2018-110220 A | 7/2018 |
| JP | 2018-206851 A | 12/2018 |
| JP | 2019-021940 A | 2/2019 |
| JP | 2019-062171 A | 4/2019 |
| JP | 2019-062179 A | 4/2019 |
| JP | 2019-106428 A | 6/2019 |
| JP | 2019-117894 A | 7/2019 |
| JP | 2019-519107 A | 7/2019 |
| WO | WO 2012/023537 A1 | 2/2012 |

OTHER PUBLICATIONS

Written Opinion mailed Sep. 1, 2020 in corresponding PCT International Application No. PCT/JP2020/025291.

Y. Nozawa, "Advances in Deep Silicon Etch Processing Using Bosch Process," J. Vac. Soc. Jpn., vol. 53, No. 7, pp. 446-453 (2010).

* cited by examiner

SEMICONDUCTOR DEVICE FORMING METHOD AND SUBSTRATE PROCESSING APPARATUS

CROSS-REFERENCE TO RELATED APPLICATIONS

The present application is a 35 U.S.C. §§ 371 national phase conversion of International Application No. PCT/JP2020/025291, filed Jun. 26, 2020, which claims priority to Japanese Patent Application No. 2019-157007, filed Aug. 29, 2019, the contents of both of which are incorporated herein by reference. The PCT International Application was published in the Japanese language.

TECHNICAL FIELD

The present invention relates to a semiconductor device forming method and a substrate processing apparatus.

BACKGROUND ART

A substrate processing apparatus for processing a substrate is used for forming a semiconductor device, for example. In recent years, stacking memory cells on a semiconductor substrate is in progress in order to finely manufacture the memory cells of a semiconductor device (see Patent Literature 1). In semiconductor memory cells of Patent Literature 1, holes with a large aspect ratio as so-called memory holes are formed in a stacked structure of a semiconductor substrate in the direction perpendicular to the substrate. A large number of memory cells are stacked in each of the holes.

CITATION LIST

Patent Literature

[Patent Literature 1]
JP2019-117894 A

SUMMARY OF INVENTION

Technical Problem

In the semiconductor memory cells of Patent Literature 1, the diameter of the lower portion of the memory hole is smaller than the diameter of the upper portion of the memory hole. This is because the etching liquid is hard to reach the lower portion of the memory hole compared to the upper portion of the memory hole. In this case, dispersion may occur in the electrical characteristics of the memory cells formed in the memory hole. The aspect ratio of the memory hole (ratio of the height and width of the memory hole) is increasing year by year, and some memory holes have an aspect ratio of more than 50 in recent years. In a memory hole having such a high aspect ratio, it is not easy to align the diameter of the upper portion of the memory hole with the diameter of the lower portion of the memory hole.

Further, with the recent miniaturization of devices or the three-dimensionalization of device structures, the same problem arises not only in the above-described memory holes but also in recesses such as holes or trenches having a large aspect ratio. That is, since the etching liquid is less likely to permeate the lower portion of the recess compared to the upper portion of the recess and liquid replacement is less likely to proceed, the lower portion of the recess is etched differently from the upper portion of the recess. As described above, in the recesses such as holes and trenches having a relatively large aspect ratio, the diameter of the recess may not be constant in the recess.

The present invention has been achieved in view of the above circumstances, and an object thereof is to provide a semiconductor device forming method and a substrate processing apparatus capable of adjusting a diameter of a recess provided in a stacked structure of a substrate by selectively etching the recess.

Solution to Problem

A semiconductor device forming method according to an aspect of the present invention includes forming a coating layer that selectively covers a portion of a recess provided in a stacked structure supported by a base member, the portion of the recess being located on a front surface side of the recess, and etching a deep portion, which is deeper than the coating layer, of the recess with a chemical liquid so as to widen a diameter of the deep portion of the recess.

In an embodiment, the forming the coating layer includes forming a partially packed bed that partially fills the deep portion of the recess, supplying a water-repellent agent after forming the partially packed bed, and removing the partially packed bed and the water-repellent agent after supplying the water-repellent agent to form the coating layer on the front surface side of the recess.

In an embodiment, the removing the partially packed bed includes supplying a removal liquid to dissolve the partially packed bed.

In an embodiment, the partially packed bed contains a substance that sublimes, and the removing the partially packed bed includes heating the partially packed bed.

In an embodiment, the forming the partially packed bed includes forming the packed bed that fills the recess, and partially removing the packed bed after the packed bed is formed.

In an embodiment, the partially removing the packed bed includes supplying a removal liquid for removing the packed bed.

In an embodiment, the chemical liquid in the etching contains any of hydrofluoric acid, water, and phosphoric acid.

In an embodiment, a plurality of memory cells are formed in the recess.

In an embodiment, in the forming the coating layer, the coating layer selectively covers the portion of the recess, which is each of a plurality of recesses, provided in the stacked structure, and differences between top diameters of the recesses are 5% or less.

In an embodiment, the recesses have a regular structure.

In an embodiment, an etch stop layer is arranged between the base member and the stacked structure.

A substrate processing apparatus according to another aspect of the present invention includes a processing liquid supply section, a removal liquid supply section, a water-repellent agent supply section, a chemical liquid supply section, and a controller. The processing liquid supply section supplies a processing liquid. The removal liquid supply section supplies a removal liquid for removing a packed bed formed from the processing liquid. The water-repellent agent supply section supplies a water-repellent agent. The chemical liquid supply section supplies a chemical liquid. The controller controls the processing liquid supply section, the removal liquid supply section, the water-repellent agent supply section, and the chemical liquid supply section. The controller controls the processing liquid supply section, the removal liquid supply section, the water-repellent agent supply section, and the chemical liquid supply section such that (1) the packed bed is formed by supplying the processing liquid, the packed bed filling a recess formed in a stacked structure supported by a base member, (2) the packed bed in the recess is partially removed by supplying the removal liquid, (3) a coating layer is formed by supplying the water-repellent agent, the coating layer selectively covering a portion of the recess, the portion of the recess being located on a front surface side not covered with the packed bed, and (4) a diameter of a deep portion, which is deeper than the coating layer, of the recess is widened by supplying the chemical liquid.

Advantageous Effects of Invention

The present invention enables the diameter of the recess provided in the stacked structure of the substrate to be adjusted.

DESCRIPTION OF EMBODIMENTS

Figure 1:
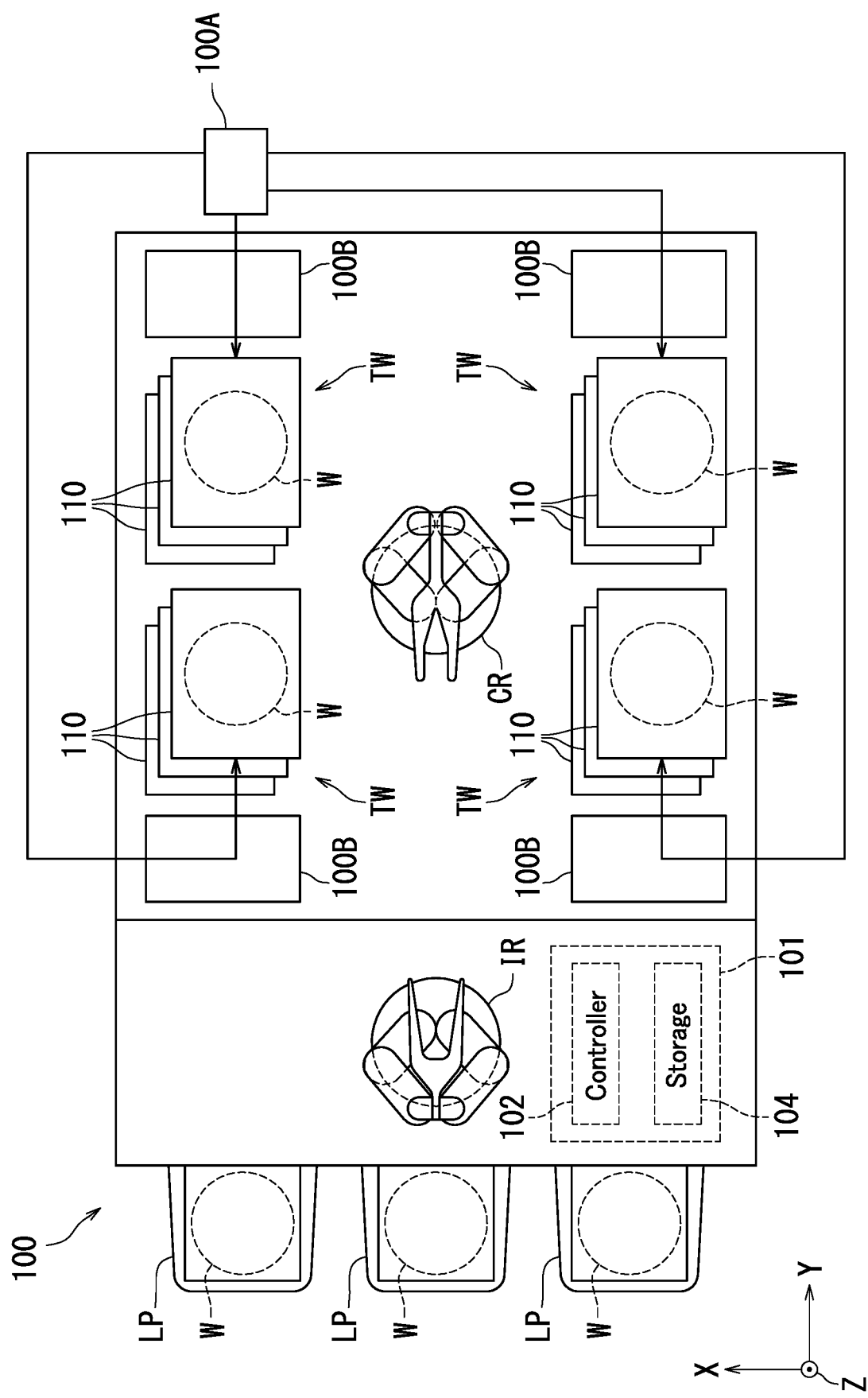
FIG. 1 is a schematic view of a substrate processing apparatus according to a present embodiment.

Semiconductor device forming methods and substrate processing apparatuses according to embodiments of the present invention will hereinafter be described with reference to the accompanying drawings. In the drawings, the same or corresponding elements are assigned the same reference signs, and descriptions thereof are not repeated. In the present specification, X-axis, Y-axis and Z-axis that are orthogonal to each other may be described to facilitate understanding of the present invention. Typically, the X-axis and Y-axis are parallel to a horizontal direction, and the Z-axis is parallel to a vertical direction. Further, in the present specification, x-axis, y-axis and z-axis that are orthogonal to each other may be described to facilitate understanding of the present invention. Typically, the x-axis and y-axis extend parallel to a substrate or a main surface of a base member, and the z-axis extends in the normal direction of the substrate or the main surface of the base member.

First, a substrate processing apparatus 100 according to an embodiment of the present invention will be described with reference to FIG. 1. FIG. 1 is a schematic plan view of the substrate processing apparatus 100 according to the embodiment.

The substrate processing apparatus 100 processes substrates W. The substrate processing apparatus 100 processes the substrates W by applying, to the substrates W, at least one of processes that include an etching process, a surface finishing process, a character imparting process, a treatment film forming process, and a process for removing and cleaning at least part of a film.

The substrates W are employed as semiconductor substrates. Each of the substrates W includes a semiconductor wafer. For example, each substrate W has a substantially disk shape. Here, the substrate processing apparatus 100 processes the substrates W one by one.

As illustrated in FIG. 1, the substrate processing device 100 includes a plurality of chambers 110, a fluid cabinet 100A, fluid boxes 100B, a plurality of load ports LP, an indexer robot IR, a center robot CR, and a control device 101. The control device 101 controls the load ports LP, the indexer robot IR, and the center robot CR. The control device 101 includes a controller 102 and storage 104.

Each of the load ports LP accommodates a plurality of substrates W in a stacked manner. The indexer robot IR conveys the substrates W between the load ports LP and the center robot CR. The center robot CR conveys the substrates W between the indexer robot IR and the chambers 110. Each of the chambers 110 discharges a liquid to a substrate W to process the substrate W. The liquid includes a processing liquid, a removal liquid, a water-repellent agent and/or a chemical liquid. The fluid cabinet 100A stores the liquid. Note that the fluid cabinet 100A may store a gas(es).

Specifically, the chambers 110 form a plurality of towers TW (four towers TW in FIG. 1) with the towers surrounding the center robot CR in a plan view. Each tower TW includes a plurality of chambers 110 (three chambers 110 in FIG. 1) stacked one above the other. Each of the fluid boxes 100B corresponds to a plurality of towers TW. The liquid in the fluid cabinet 100A is supplied, via any one of the fluid boxes 100B, to all the chambers 110 included in the tower TW corresponding to the fluid box 100B. Alternatively, the gas in the fluid cabinet 100A is supplied, via any one of the fluid boxes 100B, to all the chambers 110 included in the tower TW corresponding to the fluid box 100B.

The control device 101 controls various operations of the substrate processing device 100.

The control device 101 includes the controller 102 and the storage 104. The controller 102 includes a processor. For example, the controller 102 includes a central processing unit (CPU). Alternatively, the controller 102 may have a general-purpose arithmetic logic unit.

The storage 104 stores data and a computer program(s). The data includes recipe data. The recipe data includes information indicating a plurality of recipes. Each recipe defines processing content and processing procedure of the substrates W.

The storage 104 includes main storage and auxiliary storage. For example, the main storage is a semiconductor memory. The auxiliary storage is, for example a semiconductor memory and/or a hard disk drive. The storage 104 may include removable media. The controller 102 executes the computer program stored in the storage 104 to execute a substrate processing operation.

Figure 2:
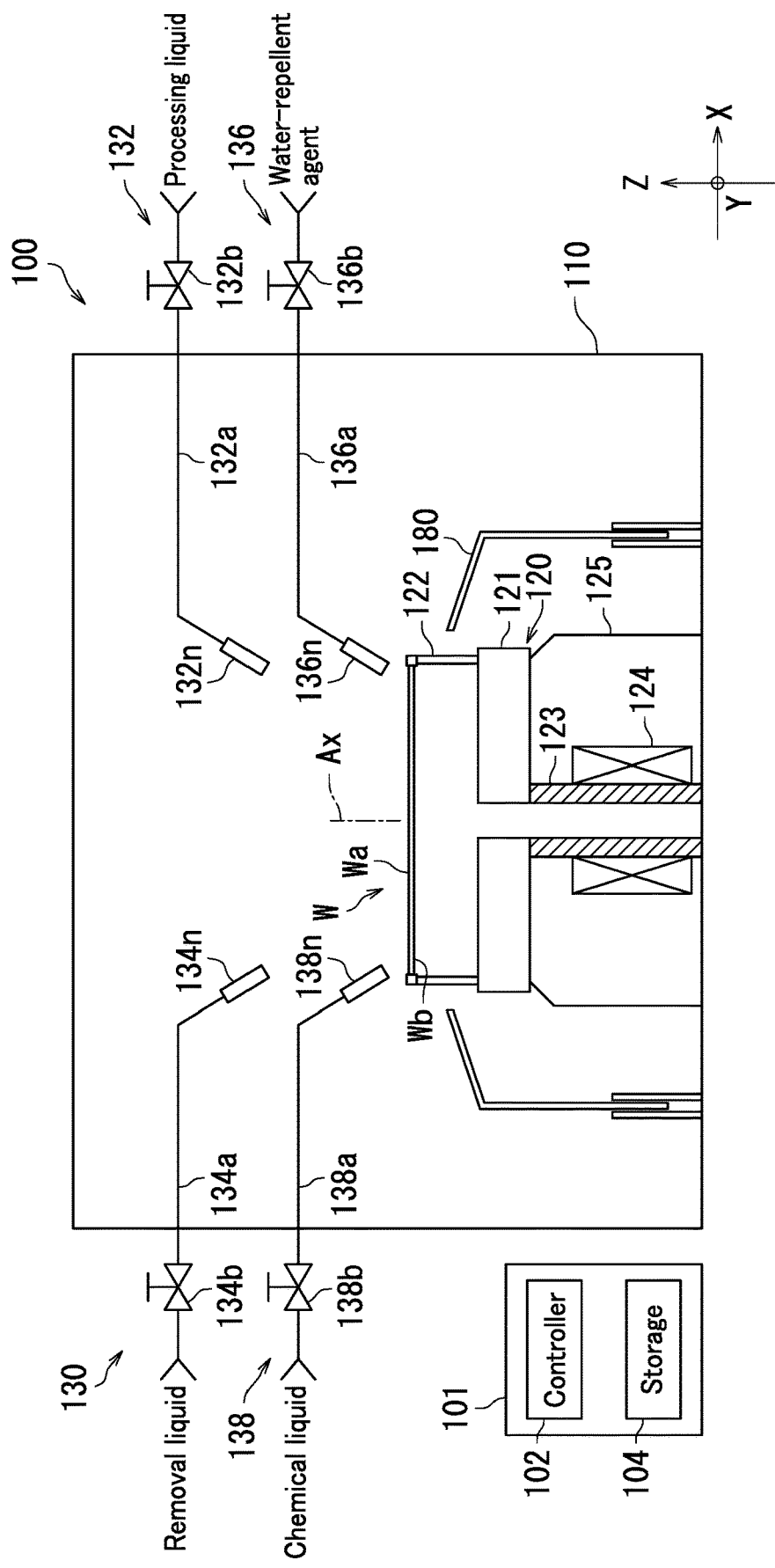
FIG. 2 is a schematic view of a substrate processing apparatus according to the present embodiment.

Next, a substrate processing apparatus 100 according to the present embodiment will be described with reference to FIG. 2. FIG. 2 is a schematic view of the substrate processing apparatus 100.

The substrate processing apparatus 100 includes a chamber 110, a substrate holding section 120, and a liquid supply section 130. The chamber 110 stores a substrate W. The substrate holding section 120 holds the substrate W.

The chamber 110 has a substantially box shape with an internal space. The chamber 110 stores a substrate W. Here, the substrate processing apparatus 100 is a single-wafer type that processes substrates W one by one. The substrates W are stored one by one in the chamber 110. A substrate W is stored in the chamber 110 and then processed in the chamber 110. The chamber 110 stores at least a part of each of the substrate holding section 120 and the liquid supply section 130.

The substrate holding section 120 holds the substrate W. The substrate holding section 120 horizontally holds the substrate W with the upper surface (front surface) Wa and the lower surface (back surface) Wb of the substrate W faced upward and downward in the vertical direction, respectively. Further, the substrate holding section 120 rotates the substrate W with the substrate W held. Although the details will be described later, a stacked structure in which a recess is placed is provided on the upper surface Wa of the substrate W. The substrate holding section 120 rotates the substrate W while holding the board W.

For example, the substrate holding section 120 may be of a pinching type that pinches the end portion of the substrate W. Alternatively, the substrate holding section 120 may have an arbitrary mechanism that holds the substrate W from the back surface Wb. For example, the substrate holding section 120 may be of a vacuum type. In this case, the substrate holding section 120 holds the substrate W horizontally with the upper surface of the substrate holding section 120 adsorbing the central portion, which is a non-device forming surface, of the back surface Wb of the substrate W. Alternatively, the substrate holding section 120 may be of a combination type of the vacuum type and the pinching type that holds the peripheral end surface of the substrate W between a plurality of chuck pins that are in contact with the peripheral end surface.

For example, the substrate holding section 120 includes a spin base 121, a chuck member 122, a shaft 123, an electric motor 124, and a housing 125. The chuck member 122 is provided on the spin base 121. The chuck member 122 chucks the substrate W. Typically, the spin base 121 is provided with a plurality of chuck members 122.

The shaft 123 is a hollow shaft. The shaft 123 extends in a vertical direction along an axis of rotation Ax thereof. The spin base 121 is coupled to the upper end of the shaft 123. The substrate W is placed above the spin base 121.

The spin base 121 has a disk shape and horizontally supports the substrate W. The shaft 123 extends downward from the central portion of the spin base 121. The electric motor 124 applies a rotational force to the shaft 123. The electric motor 124 rotates the shaft 123 in the rotation direction, thereby rotating the substrate W and the spin base 121 around the axis of rotation Ax. The housing 125 surrounds the shaft 123 and the electric motor 124.

The liquid supply section 130 supplies a liquid to the substrate W. Typically, the liquid supply section 130 supplies the liquid to an upper surface Wa of the substrate W.

The liquid supply section 130 includes a processing liquid supply section 132, a removal liquid supply section 134, a water-repellent agent supply section 136, and a chemical liquid supply section 138. The chamber 110 houses at least part of the supplies, i.e., the processing liquid supply section 132, the removal liquid supply section 134, the water-repellent agent supply section 136, and the chemical liquid supply section 138.

The processing liquid supply section 132 supplies a processing liquid to the upper surface Wa of the substrate W. For example, the processing liquid contains a solute and a volatile solvent. The processing liquid is supplied on the upper surface Wa of the substrate W, and then the solvent volatilizes, so that a packed bed is formed from the solute. The packed bed is a solid film composed of solute components. The packed bed is able to retain particles remaining in the recess of the substrate W. When the packed bed is formed, the particles adhering to the upper surface Wa of the substrate W are separated from the substrate W and retained in the packed bed.

Here, "solidification" means solidification of the solute by the force acting between molecules or atoms according to the volatilization of the solvent, for example. "Curing" means hardening of the solute by a chemical change such as polymerization or cross-link, for example. Therefore, "solidification or curing" means that the solute becomes "solid" due to various factors. Note that the processing liquid may be solidified or cured to the extent that particles can be retained and the solvent does not need to be completely volatilized. The "solute components" that form the packed bed may be the solute itself contained in the processing liquid, or may be a substance derived from the solute, for example a substance obtained as a result of a chemical change.

Various resins can be employed as the solute, which are able to be dissolved in any solvent and enable the packed bed to be formed with the particles adhering to the upper surface of the substrate W retained after being separated from the substrate W during solidification or curing. For example, a specific resin may be employed as the solute. The specific resin (hereinafter, referred to as a "thermo-induced water-soluble resin" is less soluble or insoluble in water before it is heated to a specified change-of-state temperature or higher, and becomes soluble in water by phase transition as a result of being heated to the change-of-state temperature or higher.

Examples of the thermo-induced water-soluble resin include a resin that becomes soluble in water as a result of exposing polar functional groups by thermal decomposition at a specified change-of-state temperature (for example, 200° C.) or higher. The thermo-induced water-soluble resin is heated to the specified change-of-state temperature or higher, and then becomes soluble in water.

However, the packed bed may be formed in a state where the thermo-induced water-soluble resin maintains less soluble or insoluble in a water-based liquid with the temperature of the thermo-induced water-soluble resin kept below the change-of-state temperature. When the packed bed is formed, the temperature of the processing liquid is adjusted to a temperature lower than the change-of-state temperature of the thermo-induced water-soluble resin. As a result, without changing the thermo-induced water-soluble resin to the phase in which it becomes soluble in water, a packed bed that is less soluble or insoluble in the water-based liquid is formed on the upper surface of the substrate W. In this case, the packed bed that maintains a lump state can be removed from the substrate W without dropping the particles from the packed bed. This enables the particles to be removed with a high removal rate.

Besides the thermo-induced water-soluble, usable examples of solutes that are contained in the processing liquid include acrylic resin, phenol formaldehyde resin, epoxy resin, melamine resin, urea-formaldehyde, unsaturated polyester resin, alkyd resin, polyurethane, polyimide, polyethylene, polypropylene, polyvinyl chloride, polystyrene, polyvinyl acetate, polytetrafluoroethylene, acrylonitrile butadiene styrene resin, styrene acrylonitrile resin, polyamide, polyacetal, polycarbonate, polyvinyl alcohol, denaturated-polyphenylene ether, polybutylene terephthalate, polyethylene terephthalate, polyphenylene sulfide, polysulfone, polyether ether ketone, and polyamide-imide.

The solvent is preferably more volatile than water. Preferable examples of the solvent include propylene glycol monomethyl ether (PGEE).

The processing liquid may also contain a substance that sublimes (sublimable substance). Various substances that have a high vapor pressure at 5° C. to 35° C. and that convert from a solid phase to a gas phase without their becoming a liquid phase may be employed as the sublimable substance. Usable examples of the sublimable substance include hexamethylenetetramine, 1,3,5-trioxane, ammonium 1-pyrrolidinecarbodithioate, metaldehyde, paraffin with 20 to 48 carbon atoms, t-butanol, para-dichlorobenzene, naphthalene, L-menthol, and fluorinated hydrocarbon. In particular, fluorinated hydrocarbon is preferably employed as the sublimable substance.

For example, one or more of the following compounds (A) to (E) may be employed as fluorinated hydrocarbon.
Compound (A): Fluoro alkane with 3 to 6 carbon atoms and derivative thereof
Compound (B): Fluoro cycloalkane with 3 to 6 carbon atoms and derivative thereof
Compound (C): Fluoro bicycloalkane with 10 carbon atoms and derivative thereof
Compound (D): Fluoro tetracyanoquinodimethane and derivative thereof
Compound (E): Fluoro cyclotriphosphazene and derivative thereof Fluoro alkane with 3 to 6 carbon atoms and the derivative as Compound (A) are represented by Formula (1):

$$C_mH_nF_{2m+2-n} \qquad (1),$$

where m represents a number of 3 to 6, and n represents a number of $0 \le n \le 2m+1$.

1,1,2,2,3,3,4-heptafluorocyclopentane is preferably employed as the sublimable substance. This compound has a vapor pressure of about 8266 Pa at 20° C., a melting point (freezing point) of 20.5° C., and a boiling point of 82.5° C. When the sublimable substance is mixed in the melted state, the solvent is preferably a solvent exhibiting compatibility with the sublimable substance in the melted state. When the sublimable substance is dissolved as a solute, a solvent exhibiting solubility with respect to the sublimable substance is preferable.

When the sublimable substance is mixed in the melted state, the solvent is preferably a solvent exhibiting compatibility with the sublimable substance in the melted state. When the sublimable substance is dissolved as a solute, a solvent exhibiting solubility with respect to the sublimable substance is preferable.

The solvent is, for example at least one selected from the group consisting of DIW, pure water, aliphatic hydrocarbon, aromatic hydrocarbon, ester, alcohol, and ether. Specific example thereof is at least one selected from the group consisting of DIW, pure water, methanol, ethanol, IPA, butanol, ethylene glycol, propylene glycol, N-methyl-2-pyrrolidone (NMP), N,N-dimethylformamide (DMF), dimethylacetamide (DMA), dimethyl sulfoxide (DMSO), hexane, toluene, propylene glycol monomethyl ether acetate (PGMEA), propylene glycol monomethyl ether (PGME), propylene glycol monopropyl ether (PGPE), propylene glycol monoethyl ether (PGEE), γ-butyrolactone (GBL), acetylacetone, 3-pentanone, 2-heptanone, ethyl lactate, cyclohexanone, dibutyl ether, hydrofluoroether (HFE), ethyl nonafluoro isobutyl ether, ethyl nonafluoro butyl ether, and m-xylene hexafluoride.

The processing liquid supply section 132 include a pipe 132a, a valve 132b, and a nozzle 132n. The nozzle 132n discharges the processing liquid to the upper surface Wa of the substrate W. The nozzle 132n is connected to the pipe 132a. The pipe 132a is supplied with the processing liquid from a supply source. The valve 132b opens and closes the flow path in the pipe 132a. Preferably, the nozzle 132n is configured to be movable relative to the substrate W.

The removal liquid supply section 134 supplies the removal liquid to the upper surface Wa of the substrate W. The removal liquid can remove the packed bed formed from the solute of the processing liquid. Controlling the time for supplying the removal liquid enables the packed bed to be selectively removed from the substrate W.

Any solvents that are soluble in specific resins may be employed as the removal liquid. Preferable examples of the removal liquid include organic solvents such as thinner, toluene, ester acetates, alcohols, and glycols as well as acid liquids such as acetic acids, formic acids, and hydroxyacetic acids. It is desirable to use a solvent that is compatible with a water-based liquid in particular. For example, isopropyl alcohol (IPA) is preferably employed as the removal liquid.

The removal liquid supply section 134 includes a pipe 134a, a valve 134b, and a nozzle 134n. The nozzle 134n discharges the removal liquid to the upper surface Wa of the substrate W. The nozzle 134n is connected to the pipe 134a. The pipe 134a is supplied with the removal liquid from a supply source. The valve 134b opens and closes the flow path in the pipe 134a. Preferably, the nozzle 134n is configured to be movable relative to the substrate W.

The water-repellent agent supply section 136 supplies a water-repellent agent in the form of a liquid to the upper surface Wa of the substrate W. As a result of supplying the water-repellent agent, a water-repellent layer is formed on the upper surface Wa of the substrate W For example, the water-repellent agent contains a compound containing a methyl group or a silyl group at the end. Typically, a hydroxyl group (OH group) is present on the surface of the recess, but the hydroxyl group on the surface of the substrate W is replaced with a methyl group or a silyl group by the water-repellent agent. It is preferable that the water-repellent agent does not change the characteristics of the packed bed.

For example, the water-repellent agent is a water-repellent agent that causes silicon (Si) itself and a compound containing silicon to be hydrophobic. Typically, the water-repellent agent is a silane coupling agent. In one example, the silane coupling agent includes at least one of compounds including hexamethyldisilazane (HMDS), tetramethylsilane (TMS), fluorinated alkylchlorosilane, alkyl disilazane, and non-chloro water-repellent agent. For example, the non-chloro water-repellent agent includes at least one of compounds including dimethylsilyl-dimethylamine, dimethylsilyl-diethylamine, hexamethyl-disilazane, tetramethyl disilazane, bis (dimethylamino) dimethylsilane, N, N-dimethylaminotrimethylsilane, N-(trimethylsilyl) dimethylamine, and organosilane compound.

The water-repellent agent supply section 136 includes a pipe 136a, a valve 136b, and a nozzle 136n. The nozzle 136n discharges the water-repellent agent to the upper surface Wa of the substrate W. The nozzle 136n is connected to the pipe 136a. The pipe 136a is supplied with the water-repellent agent from a supply source. The valve 136b opens and closes the flow path in the pipe 136a. Preferably, the nozzle 136n is configured to be movable relative to the substrate W.

The chemical liquid supply section 138 supplies the chemical liquid to the upper surface Wa of the substrate W. The upper surface Wa of the substrate W can be treated by the chemical liquid treatment with the chemical liquid. The chemical liquid treatment enables the substrate W to be processed by any of etching, surface treatment, property imparting, treatment film formation, and removal of at least partial film. Typically, the chemical liquid is an etching liquid used for etching the substrate W.

The chemical liquid contains hydrofluoric acid. For example, hydrofluoric acid may be heated to 40° C. or higher and 70° C. or lower, or 50° C. or higher and 60° C. or lower. However, hydrofluoric acid does not have to be heated. The chemical liquid may also contain water or phosphoric acid.

The chemical liquid may further contain a hydrogen peroxide solution. The chemical liquid may contain ammonia-hydrogen peroxide mixture (SC1), hydrochloric acid-hydrogen peroxide mixture (SC2), or a mixture of concentrated hydrochloric acid and concentrated nitric acid (aqua regia).

The chemical liquid supply section 138 includes a pipe 138a, a valve 138b, and a nozzle 138n. The nozzle 138n discharges the chemical liquid to the upper surface Wa of the substrate W. The nozzle 138n is connected to the pipe 138a. The pipe 138a is supplied with the chemical liquid from a supply source. The valve 138b opens and closes the flow path in the pipe 138a. Preferably, the nozzle 138n is configured to be movable relative to the substrate W.

As described above, the nozzles 132n, 134n, 136n, and 138n of the processing liquid supply section 132, the removal liquid supply section 134, the water-repellent agent supply section 136, and the chemical liquid supply section 138 may be movable. The nozzles 132n, 134n, 136n, and 138n can move horizontally and/or vertically according to a moving mechanism controlled by a controller 102. Note that in this specification, the moving mechanism is omitted in order to avoid making the drawings excessively complicated.

The substrate processing apparatus 100 further includes a cup 180. The cup 180 collects liquids scattered from the substrate W. The cup 180 moves up and down. For example, the cup 180 keeps a vertically risen state up to the side of the substrate W while the liquid supply section 130 supplies the liquids to the substrate W. In this case, the cup 180 collects the liquids scattered from the substrate W due to the rotation of the substrate W. The liquid supply section 130 finishes supplying the liquids to the substrate W, and then the cup 180 descends vertically down from the side of the substrate W.

As described above, the control device 101 includes the controller 102 and storage 104. The controller 102 controls the substrate holding section 120, the processing liquid supply section 132, the removal liquid supply section 134, the water-repellent agent supply section 136, and/or the cup 180. In one example, the controller 102 controls the electric motor 124, the valves 132b, 134b, 136b and/or 138b.

The substrate processing apparatus 100 according to the present embodiment is suitably used for manufacturing semiconductor devices including semiconductors. Typically, in a semiconductor device, a conductive layer and an insulating layer are laminated on a base member. The substrate processing apparatus 100 is suitably used for cleaning and/or processing (for example, etching, characteristic change) the conductive layer and/or the insulating layer when the semiconductor device is manufactured.

Figure 3:
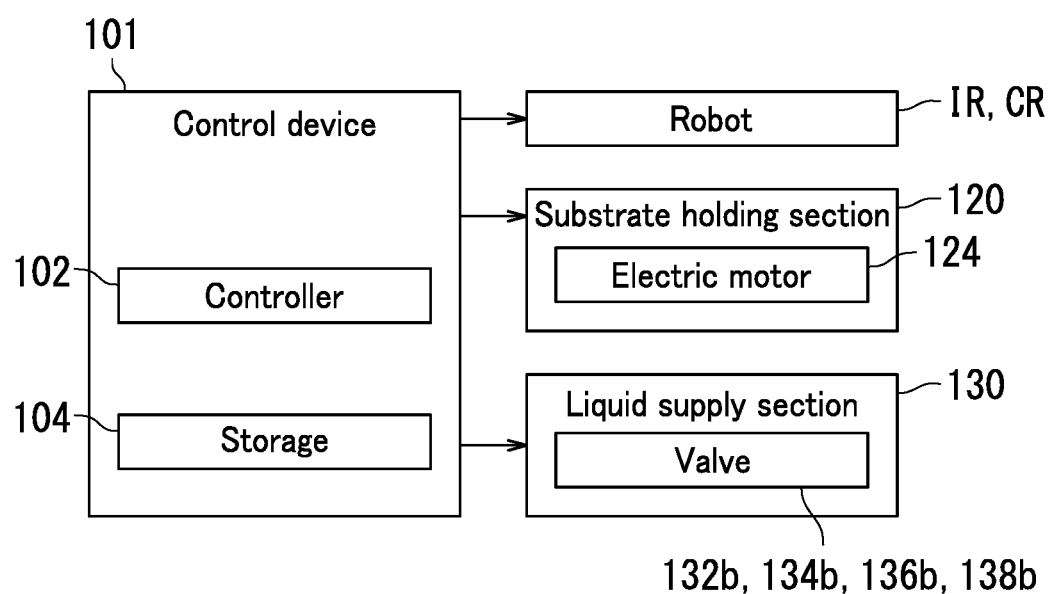
FIG. 3 is a block diagram of the substrate processing apparatus according to the present embodiment.

Next, the substrate processing apparatus 100 according to the present embodiment will be described with reference to FIGS. 1 to 3. FIG. 3 is a block diagram of the substrate processing apparatus 100.

As illustrated in FIG. 3, the control device 101 controls various operations of the substrate processing apparatus 100. The control device 101 controls an indexer robot IR, a center robot CR, the substrate holding section 120, and the liquid supply section 130. Specifically, the control device 101 transmits respective control signals to the indexer robot IR, the center robot CR, the substrate holding section 120, and the liquid supply section 130, thereby controlling the indexer robot IR, the center robot CR, the substrate holding section 120, and the liquid supply section 130.

Specifically, the controller 102 controls the indexer robot IR so that the indexer robot IR receives and delivers the substrate W.

The controller 102 controls the center robot CR so that the center robot CR receives and delivers the substrate W. For example, the center robot CR receives an unprocessed substrate W and carries the substrate W in any one of the plurality of chambers 110. The center robot CR also receives the processed substrate W from the chamber 110 and carries out the substrate W.

The controller 102 controls the substrate holding section 120 to control the start, the speed change, and the stop of the rotation of the substrate W. For example, the controller 102 can control the substrate holding section 120 to change the rotation speed of the substrate holding section 120. Specifically, the controller 102 can change the rotation speed of the substrate W by changing the rotation speed of the electric motor 124 of the substrate holding section 120.

The controller 102 can separately control the valves 132b, 134b, 136b, and 138b of the liquid supply section 130 to switch the states of the valves 132b, 134b, 136b, and 138b between open and closed states. Specifically, the controller 102 controls the valves 132b, 134b, 136b, 138b of the liquid supply section 130 and then opens the valves 132b, 134b, 136b, 138b which thereby allow the processing liquid, the removal liquid, the water-repellent agent, and the chemical liquid flowing in the pipes 132a, 134a, 136a and 138a to pass towards the nozzles 132n, 134n, 136n, and 138n. The controller 102 also controls the valves 132b, 134b, 136b, and 138b of the liquid supply section 130 and then closes the valves 132b, 134b, 136b, and 138b which thereby stop the processing liquid, the removal liquid, the water-repellent agent and the chemical liquid flowing in the pipes 132a, 134a, 136a, and 138a from being supplied toward the nozzles 132n, 134n, 136n, and 138n.

The substrate processing apparatus 100 according to the present embodiment is suitably used for forming semiconductor devices. For example, the substrate processing apparatus 100 is suitably used for processing a substrate W employed as a semiconductor device having a stacked structure. The semiconductor device is a so-called 3D structure memory (storage device). In one example, the substrate W is suitably used for NAND flash memories.

Figure 4A:
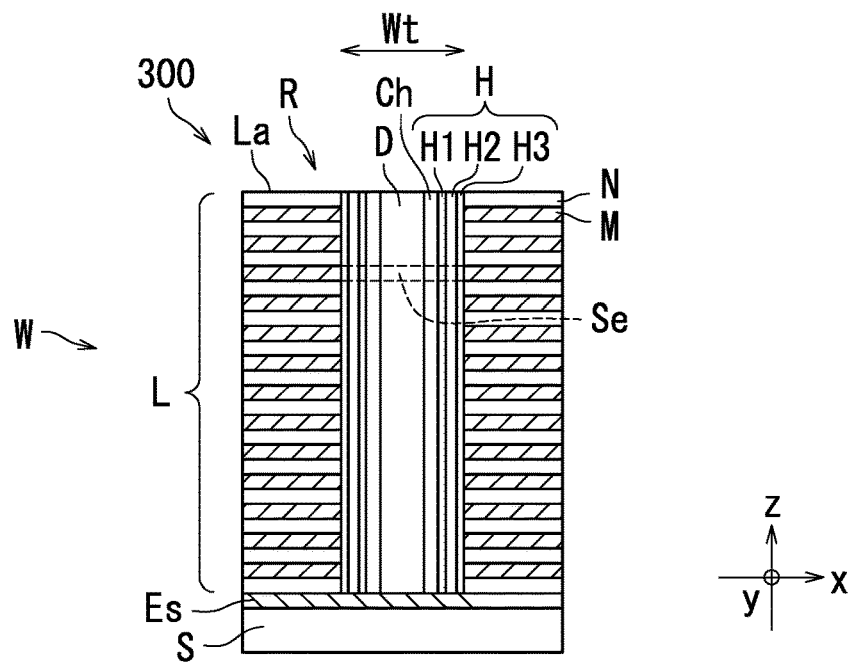
FIG. 4A is a schematic side view of a semiconductor device manufactured by using the substrate processing apparatus according to the present embodiment.
Figure 4B:
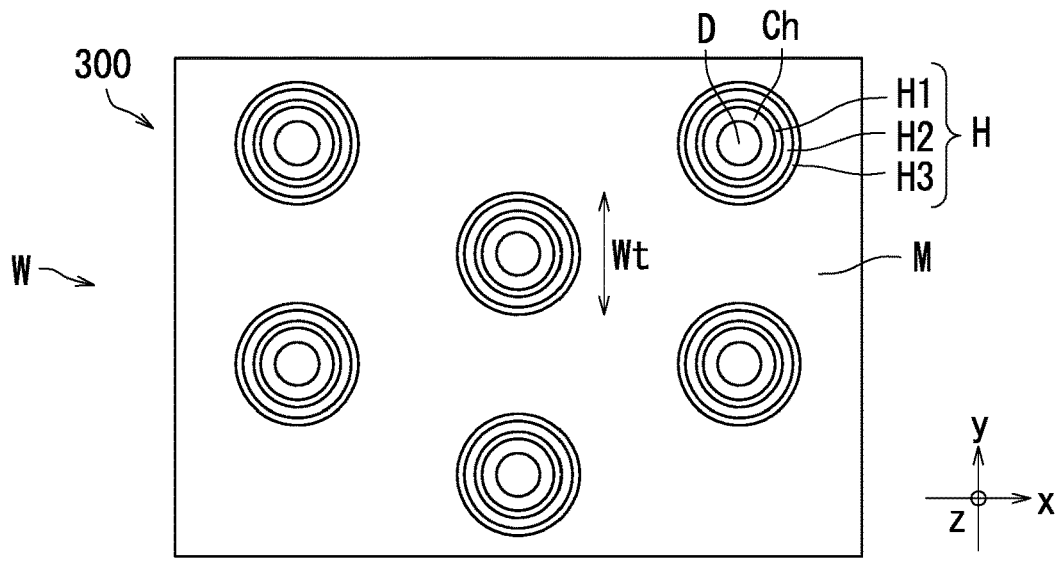
FIG. 4B is a schematic top view of the semiconductor device.
Figure 4C:
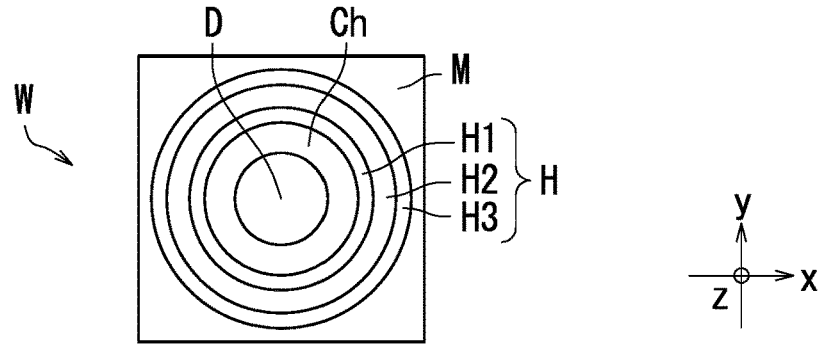
FIG. 4C is a partially enlarged view of FIG. 4B.

Next, a substrate W manufactured as a semiconductor device 300 using the substrate processing apparatus 100 according to the present embodiment will be described with reference to FIGS. 4A to 4C. FIG. 4A is a schematic side view of the semiconductor device 300 manufactured by processing the substrate W using the substrate processing apparatus 100. FIG. 4B is a schematic top view of the semiconductor device 300. FIG. 4C is a partially enlarged view of FIG. 4B. In FIGS. 4A to 4C, the direction orthogonal to the main surface of a base member S of the substrate W is illustrated as the z-direction, and the directions orthogonal to the z-direction are illustrated as the x-direction and the y-direction.

As illustrated in FIG. 4A, the substrate W includes the base member S and a stacked structure L. The base member S is in the form of a thin film spreading in the xy plane. The stacked structure L is formed on the upper surface of the base member S. The base member S supports the stacked structure L. The stacked structure L extends in the z-direction from the upper surface of the base member S.

Note that the substrate W illustrated in FIG. 4A further includes an etch stop layer Es between the base member S and the stacked structure L. The etch stop layer Es is made of, for example alumina ($Al_2O_3$). Although the details will be described later, the stacked structure L is partially removed by etching, so that a recess R is formed. Etching stops at the etch stop layer Es.

The stacked structure L includes insulating layers N and conductive layers M. The insulating layers N and the conductive layers M are alternately laminated. For example, each insulating layer N is formed from a silicon oxide film. The conductive layers M are made of metal. For example, the conductive layers M contain tungsten (W).

Each of the insulating layers N extends parallel to the upper surface of the base member S. Each of the conductive layers M is provided between corresponding two adjacent insulating layers N, and supports the two adjacent insulating layers N.

For example, each insulating layer N is 1 nm or more and 50 nm or less in thickness (length in the z-direction). Each conductive layer M is 1 nm or more and 50 nm or less in thickness (length in the z-direction).

The total thickness of one insulating layer N and one conductive layer M is 20 nm or more and 100 nm or less. The stacked structure L includes 10 or more and 100 or less insulating layers N and 10 or more and 100 or less conductive layers M.

The stacked structure L is provided with the recess R. The recess R extends in a direction perpendicular to the main surface of the base member S. The recess R extends a front surface La of the stacked structure L through the etch stop layer Es.

The recess R has an aperture (diameter) of an order of a nanometer. For example, the recess R is 20 nm or more and 300 nm or less in diameter. The recess R may be 50 nm or more and 200 nm or less in diameter.

Ideally, the recess R is formed perpendicular to the main surface of the substrate S. The diameter (top diameter Wt) of the front surface portion of the recess R is 20 nm or more and 300 nm or less, or 50 nm or more and 200 nm or less.

For example, the recess R has an aspect ratio of 10 or more. Further, it has been reported so far that a memory hole that is about 1 μm in height is formed with an aspect ratio of 40 to 50. It is expected that the aspect ratio will increase further in the future. For example, the upper limit of the aspect ratio of the recess R may be 100 or 200.

In the semiconductor device 300 illustrated in FIG. 4A, cylindrical charge holding layers H are provided in the recess R of the substrate W. A cylindrical channel layer Ch is provided inside the charge holding layers H. For example, the channel layer Ch is formed from polysilicon. A cylindrical dielectric layer D is provided inside the channel layer Ch. The dielectric layer D is formed from a silicon oxide film.

The charge holding layers H may have a three-layer structure. For example, the charge holding layers H include a cylindrical inner layer H1, a cylindrical intermediate layer H2, and a cylindrical outer layer H3. The outer layer H3 is in contact with the stacked structure L. The intermediate layer H2 is arranged inside the outer layer H3. The inner layer H1 is arranged inside the intermediate layer H2. The inner layer H1 is in contact with the channel layer Ch. That is, the dielectric layer D, the channel layer Ch, the inner layer H1, the intermediate layer H2, and the outer layer H3 are arranged from the center of the recess R of the stacked structure L.

For example, the inner layer H1 is formed from a silicon oxide film. The inner layer H1 is also called a tunnel layer.

For example, the intermediate layer H2 is formed from a silicon nitride film. The intermediate layer H2 accumulates an electric charge. The intermediate layer H2 is also called a charge storage layer.

For example, the outer layer H3 is formed from a silicon oxide film. The outer layer H3 is also called a block layer.

A voltage is applied across the conductive layer M and the channel layer Ch, so that an electric charge is accumulated in the corresponding intermediate layer H2. As illustrated in FIG. 4A, a corresponding memory cell Se is formed for each conductive layer M. As a result, one recess R is provided with memory cells SE whose number corresponds to the number of the conductive layers M.

As illustrated in FIG. 4B, a plurality of recesses R are formed in the substrate W, and the recesses R are regularly arranged in the substrate W. Each of the recesses R is provided with charge holding layers H, a channel layer Ch, and a dielectric layer D. The recesses R are designed to have similar diameters and heights. For example, the difference in top diameter Wt between the recesses R may be 5% or less, or 3% or less.

Typically, the recess R is formed by dry etching the stacked structure L. Dry etching the stacked structure L to form the recesses R may cause the diameter of the deep portion of each recess R to be smaller than the diameter of the front surface side of each recess R. In particular, as the height of and/or the number of stacks of the stacked structure increases, the diameter of the deep portion of each recess R tends to be smaller than the diameter of the front surface side of each recess R. Further, as processing time of dry etching is shortened in order to improve the throughput, the diameter of the deep portion of each recess R tends to be smaller than the diameter of the front surface side of each recess R.

As illustrated in FIG. 4A, a plurality of memory cells Se are formed in the recess R. Therefore, the diameter of the recess R is preferably constant from the front surface side portion to the deep portion. However, when the recess R is formed in the stacked structure L, the diameter of the recess R may not be constant. When the recesses R have different diameters, the memories cells are formed in the recess R and then the electrical characteristics of the memory cells may not be constant, so that the characteristics of the memory cells may not be uniform.

In general, the smaller the diameter of the recess R is, the more memory cells the base member can include. Therefore, in order to increase the memory capacity, it is desirable that the diameter of the recess R be small. However, if the diameter of the recess R is small, the flow of the etching fluid for etching the recess R tends to be insufficient. Therefore, when the recess R is etched, the etching tends to be biased according to the position of the recess R. Specifically, the front surface side portion of the recess R is relatively easy to be etched, whereas the deep portion of the recess R is relatively difficult to be etched.

Although details will be described later, the present embodiment enables a deep portion Rf of the recess R to be selectively etched even if the diameter of the recess R is small. It is therefore possible to prevent the diameter of the recess R from becoming uneven.

Next, a semiconductor device forming method according to the present embodiment will be described with reference to FIGS. 5A to 5E. Part of the semiconductor device forming method according to the present embodiment is performed by using the substrate processing device 100 described above with reference to FIGS. 1 to 3.

Figure 5A:
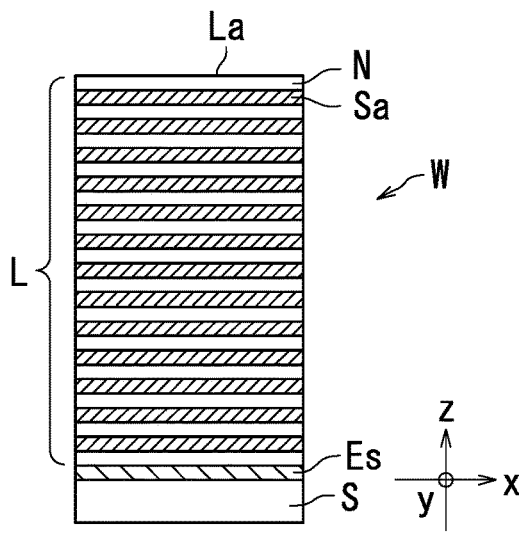
FIGS. 5A to 5E are schematic diagrams for describing a semiconductor device forming method according to the present embodiment.

As illustrated in FIG. 5A, a substrate W includes a base member S and a stacked structure L. The base member S is in the form of a thin film spreading in the xy-plane. The stacked structure L is formed on the upper surface of the base member S. The stacked structure L extends in the z-direction from the upper surface of the base member S. For example, the stacked structure L is formed from a silicon oxide film and a silicon nitride film. The stacked structure L has a front surface La.

The stacked structure L includes insulating layers N and sacrificial layers Sa. The insulating layers N and the sacrificial layers Sa are alternately laminated. Each of the insulating layers N extends parallel to the upper surface of the base member S. Each of the sacrificial layers Sa is provided between corresponding two adjacent insulating layers N, and supports the two adjacent insulating layers N. Note that the sacrificial layers Sa are replaced with conductive layers M illustrated in FIGS. 4A to 4C in the process of manufacturing a semiconductor device 300.

For example, each insulating layer N is 1 nm or more and 50 nm or less in thickness (length in the z-direction). Each insulating layer N is formed from a silicon oxide film.

For example, each sacrificial layer Sa is 1 nm or more and 50 nm or less in thickness (length in the z-direction). For example, each sacrificial layer Sa is formed from a material to be etched when an etching liquid that does not substantially etch the insulating layers N is used. In one example, each sacrificial layer Sa is formed from a silicon nitride film. For example, when phosphoric acid is used as the etching liquid, the sacrificial layers Sa can be etched without substantially etching the insulating layers N.

Figure 5D:
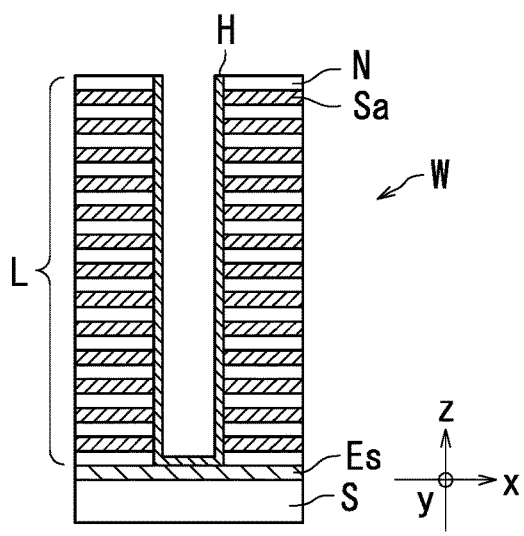
Figure 5B:
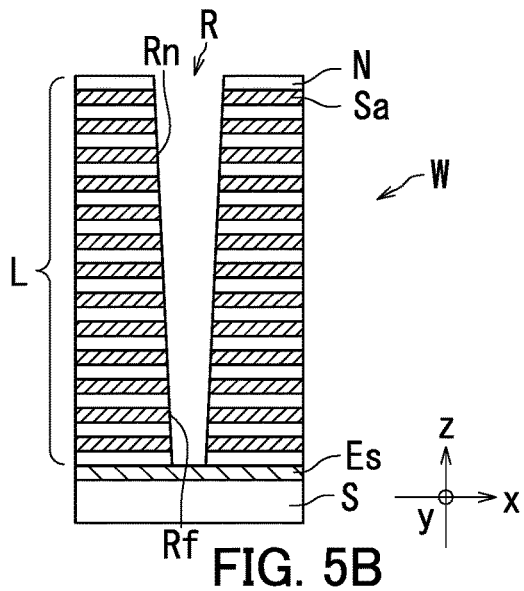

As illustrated in FIG. 5B, a recess R is formed in the stacked structure L. Typically, the recess R is formed by dry etching. The recess R whose diameter (length in the xy-plane) is constant from the front surface side to a deep portion is ideal for the recess R formed by the dry etching, but the actual recess R may not have the diameter that is constant from the front surface side to the deep portion. In particular, when the processing time of dry etching is shortened in order to improve the throughput of the substrate W, the diameter of the recess R is unlikely to be constant from the front surface side to the deep portion. In this case, the diameter of the deep portion Rf of the recess R is smaller than the diameter of the front surface side portion Rn of the recess R.

Figure 5E:
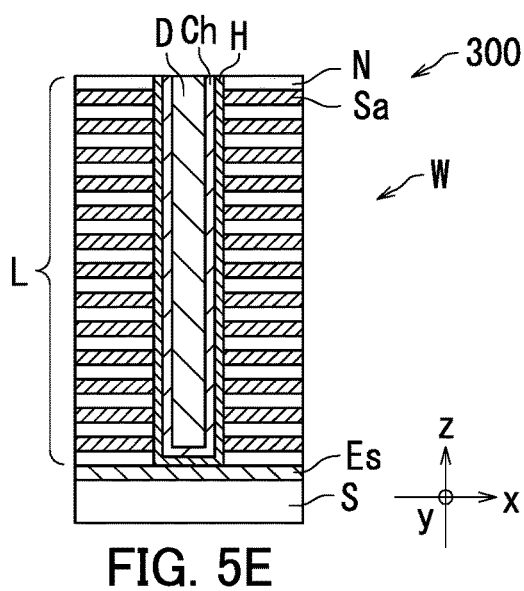
Figure 5C:
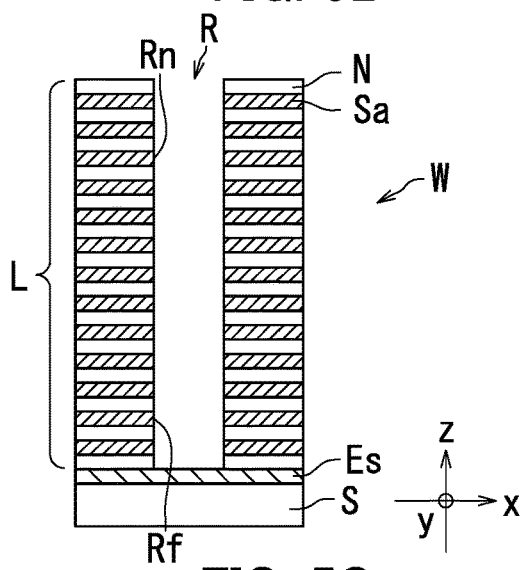

As illustrated in FIG. 5C, the recess R of the substrate W is deformed. For example, the diameter of the deep portion Rf of the recess R is selectively made larger than the diameter of the deep portion Rf of the recess R after the dry etching. In one example, the diameter of the deep portion Rf of the recess R is extended up to the length of less than 10 nm in the xy-plane. This enables the diameter of the recess R in the substrate W to be made uniform from the front surface side to the deep portion.

As illustrated in FIG. 5D, a charge holding layer H is formed inside the recess R of the stacked structure L.

As illustrated in FIG. 5E, a channel layer Ch and a dielectric layer D are formed inside the charge holding layer(s) H. The sacrificial layers Sa are subsequently replaced with the conductive layers M. As described above, the semiconductor device 300 illustrated in FIGS. 4A to 4C can be formed.

In addition, in FIG. 5B, the diameter of the recess R is illustrated that it changes linearly from the front surface side to the deep portion in order to avoid overly complicated explanation. The present embodiment is however not limited to this. The diameter of the recess R may be the largest near the central portion due to the bowing phenomenon.

Next, a semiconductor device forming method according to the present embodiment will be described with reference to FIGS. 1 to 3 and 6A to 6G. FIGS. 6A to 6G are schematic views for illustrating the semiconductor device forming method according to the present embodiment. The semiconductor device forming method illustrated in FIGS. 6A to 6G is preferably used as part of the above-mentioned semiconductor device forming method described with reference to FIGS. 5A to 5E. For example, the semiconductor device forming method illustrated in FIGS. 6A to 6G is used for the modification of the recess R illustrated in FIG. 5C. The semiconductor device forming method according to the present embodiment is performed using the substrate processing apparatus 100 described above with reference to FIGS. 1 to 3.

Figure 6A:
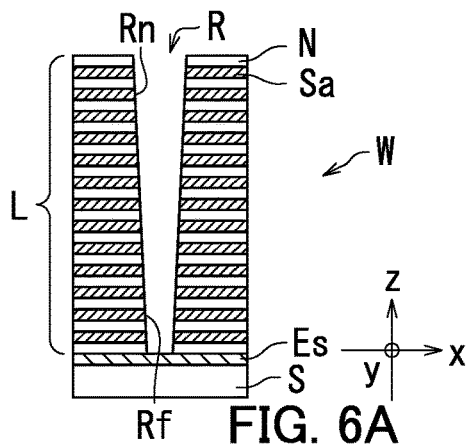
FIGS. 6A to 6G are schematic diagrams for describing the semiconductor device forming method according to the present embodiment.

As illustrated in FIG. 6A, a stacked structure L is provided with a recess R. For example, the recess R is formed in the stacked structure L as a result of etching the substrate W. Here, the recess R is formed in insulating layers N and sacrificial layers Sa. The recess R reaches an etch stop layer Es.

Figure 6B:
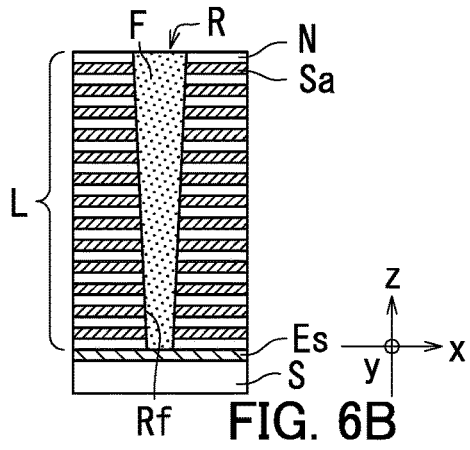

As illustrated in FIG. 6B, the recess R is filled with a packed bed F. The packed bed F is, for example an organic substance (carbon-based material). In one example, the packed bed F is a polymer. The packed bed F may be formed from a resist. For example, when the processing liquid supply section 132 supplies a processing liquid to a substrate W and then volatilizes a solvent from the processing liquid, the packed layer F is formed from a solute of the processing liquid. Here, the packed bed F is filled from a deep portion Rf to a front surface side portion Rn of the recess R.

Preferably, the processing liquid changes to a solid state after being applied to the substrate W. The processing liquid itself is in a liquid state, but when the processing liquid is applied to the substrate W and then the solvent volatilizes, the solute changes to a solid state to form the packed bed F.

Figure 6C:
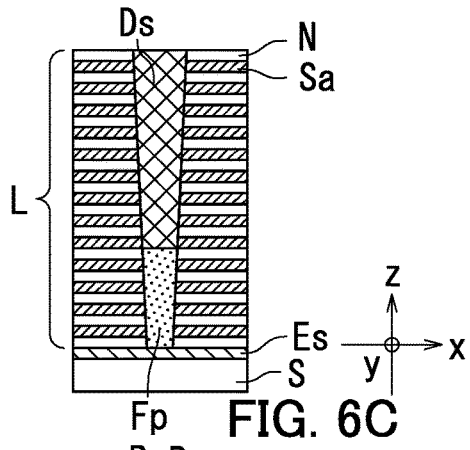

As illustrated in FIG. 6C, a removal liquid Ds is applied to the substrate W. The removal liquid Ds dissolves the packed bed F. Here, the removal liquid Ds partially dissolves the packed bed F filled in the recess R. The front surface side portion Rn of the recess R is therefore replaced with the removal liquid Ds with the packed bed F still filled in the deep portion Rf of the recess R. As a result, a partially packed bed Fp that is partially filled in the deep portion Rf of the recess R is formed from the packed bed F.

For example, the removal liquid supply section 134 supplies the removal liquid Ds to the substrate W. The removal liquid supply section 134 supplies the removal liquid Ds whose supply time and amount are set so as to partially dissolve the packed bed F without completely dissolving it. For example, the removal liquid Ds contains isopropyl alcohol (IPA).

Typically, more than half of the packed bed F within the depth of the recess R is replaced with the removal liquid Ds, and less than half of the packed bed F within the depth of the recess R remains to form the partially packed bed Fp. For example, the depth of the partially packed bed Fp (length in the z-axis direction) is ⅓ or less of the depth of the recess R.

Figure 6D:
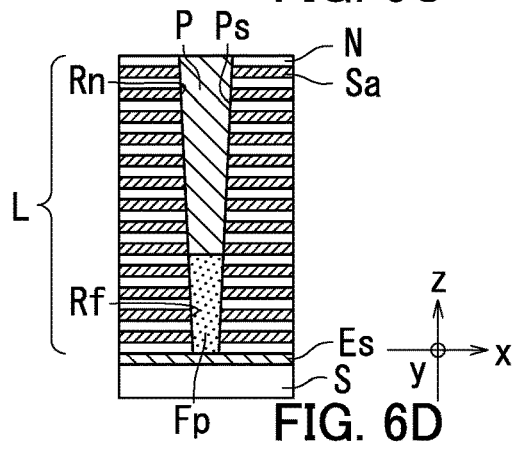

As illustrated in FIG. 6D, a water-repellent agent P is supplied. For example, the water-repellent agent supply section 136 supplies the water-repellent agent P to the substrate W. The partially packed bed Fp is not affected by the water-repellent agent P, and the removal liquid Ds is replaced with the water-repellent agent P. As a result, the removal liquid Ds in the front surface side portion Rn of the recess R is replaced with the water-repellent agent P with the partially packed bed Fp still filled in the deep portion Rf of the recess R.

The deep portion Rf of the recess R is covered with the partially packed bed Fp, whereas the front surface side portion Rn of the recess R is not covered with the partially packed bed Fp. Therefore, the water-repellent agent P is supplied and then reacts with the surface of the stacked structure L in the front surface side portion Rn of the recess R, so that a coating layer Ps is formed.

Figure 6E:
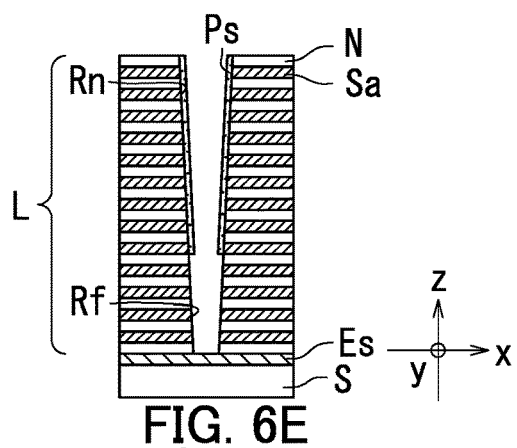

As illustrated in FIG. 6E, the partially packed bed Fp and the water-repellent agent P are removed. In this case, part of the water-repellent agent P in the front surface side of the recess R is removed together with the partially packed bed Fp in the deep portion Rf of the recess R. At this time, particles which are residue when the recess R is formed (for example, during dry etching) are preferably removed. The removal of the partially packed bed Fp exposes the insulating layers N and the sacrificial layers Sa in the deep portion Rf of the recess R. On the other hand, the front surface side portion Rn of the recess R remains covered with the coating layer Ps.

For example, a removal liquid may be applied to remove the partially packed bed Fp and the water-repellent agent P. In one example, the removal liquid contains IPA. For example, the removal liquid supply section 134 supplies the removal liquid Ds to the substrate W. The removal liquid supply section 134 supplies the removal liquid whose supply time and amount are set such that the partially packed bed Fp is completely dissolved.

Alternatively, the substrate W may be heated to remove the partially packed bed Fp and the water-repellent agent P. For example, when the partially packed bed Fp is formed from a sublimable substance, the partially packed layer Fp may be sublimated by heating.

Figure 6F:
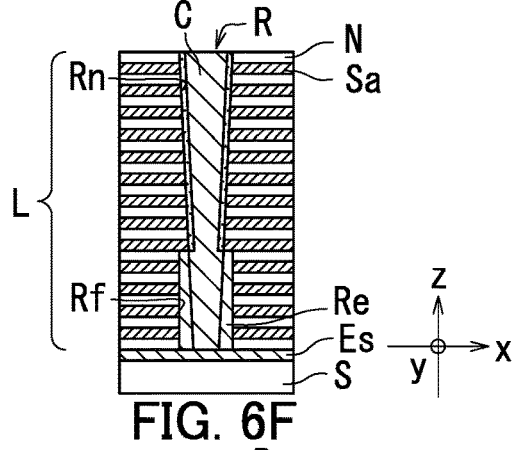

As illustrated in FIG. 6F, the recess R is etched with a chemical liquid C. Typically, the chemical liquid C contains hydrofluoric acid. For example, the chemical liquid C contains hydrofluoric acid diluted in the range of 1:100 to 1:2000. Alternatively, the chemical liquid C may contain water or deionized water (DIW). The chemical liquid C may contain phosphoric acid instead.

Since the insulating layers N and the sacrificial layers Sa are exposed, the deep portion Rf of the recess R is etched by the chemical liquid C. On the other hand, the front surface side portion Rn of the recess R is covered with the coating layer Ps, and therefore not etched by the chemical liquid C. Accordingly, as illustrated in FIG. 6F, a region Re located in the deep portion Rf of the recess R is removed by the chemical liquid C, and the diameter of the recess R is expanded so as to widen. The diameter of the deep portion Rf of the recess R may be widened so as to be equal to the diameter (top diameter) in the front of the recess R.

Figure 6G:
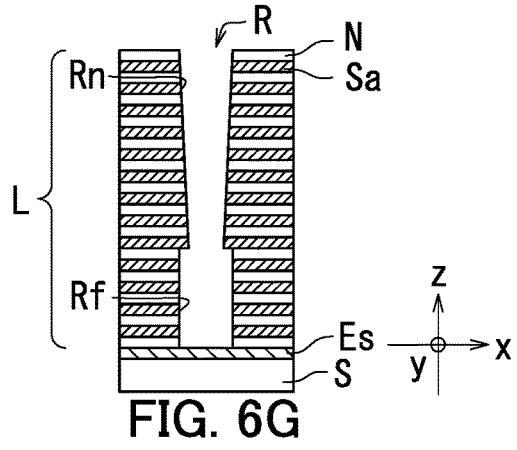

As illustrated in FIG. 6G, the chemical liquid C and the coating layer Ps are removed. The chemical liquid C and the coating layer Ps may be removed by ultraviolet radiation or heating. At this time, residue during dry etching is preferably removed. The removal of the chemical liquid C and the coating layer Ps may be performed by another device different from the substrate processing apparatus 100.

As described above, the diameter of the recess R in the stacked structure L can be adjusted. FIGS. 6E, 6F, and 6G illustrate that in order to easily understand the change in the shape of the recess R, the diameter of the deep portion Rf of the recess R equals the top diameter (aperture) of the recess R, while being larger than the diameter of the central portion of the recess R, but note that this is only an example. In the recess R, the diameter of the deep portion Rf of the recess R may be widened so that the diameter of the deep portion Rf of the recess R equals the diameter of the central portion of the recess R. Alternatively, the recess R may be modified so that the diameter of the deep portion Rf of the recess R equals the diameter of the top diameter and the diameter of the central portion of the recess R.

Note that in FIG. 6C, by applying the removal liquid Ds, the packed bed F is partially replaced with the removal liquid Ds. When the diameter of the recess R is small, it takes a relatively long time for the removal liquid Ds to remove the entire packed bed F. Therefore, the packed bed F can be partially removed by interrupting the removal process of the packed bed F by the removal liquid Ds in the middle of the time in which the removal liquid Ds is to remove the entire packed layer F. Further, as illustrated in FIG. 6C, adjusting the amount, the processing time and the like of the removal liquid Ds enables the partially packed bed Fp coating an appropriate portion to be left.

In FIG. 6C, the partially packed bed Fp is formed from the packed bed F by using the removal liquid Ds, but the present embodiment is not limited to this. When the packed bed F is formed from a sublimable substance, the partially packed bed Fp may be formed from the packed bed F by heating. Also in this case, by adjusting the heating time and temperature, the partially packed bed Fp that partially fills the deep portion Rf of the recess R may be formed from the packed bed F.

Note that the substrate W is preferably employed as a memory including a plurality of memory cells Se. Typically, when the substrate W is employed as the memory, the substrate W is provided with a plurality of recesses R designed to have a constant diameter and height. Therefore, a plurality of recesses used for a memory having a large storage capacity can be simultaneously transformed by the same processing.

When forming the recess R in the stacked structure L, the diameter of the recess R may become the largest in the vicinity of the central portion due to bowing phenomenon. In this case, the coating layer Ps preferably covers the vicinity of the central portion. The diameter of the deep portion Rf of the recess R may be expanded by etching so as to equal the diameter of the largest central portion of the recess R.

In the above description with reference to FIGS. 6A to 6G, the coating layer Ps is formed by supplying the water-repellent agent P in the form of a liquid to the recess R filled with the partially packed bed Fp, but the present embodiment is not limited to this. The coating layer Ps may be formed by a gas.

Figure 7:
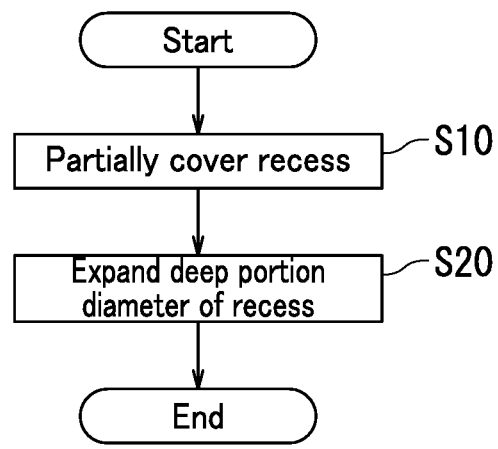
FIG. 7 is a flow chart of the semiconductor device forming method according to the present embodiment.

Next, a semiconductor device forming method according to the present embodiment will be described with reference to FIGS. 1 to 3, 6A to 6G and 7. FIG. 7 is a flow chart of the semiconductor device forming method. The semiconductor device forming method according to the present embodiment is preferably performed by the substrate processing apparatus 100 described above with reference to FIGS. 1 to 3.

First, in Step S10, the recess R in the stacked structure L is partially coated. Typically, the front surface side portion Rn of the recess R is selectively coated. For example, the coating layer Ps is formed on the front surface side portion Rn of the recess R. The coating layer Ps selectively covers the front surface side portion Rn of the recess R, but does not cover the deep portion Rf of the recess R. Therefore, the stacked structure L is exposed in the deep portion Rf of the recess R.

In Step S20, the diameter of the deep portion Rf of the recess R is expanded. Applying the chemical liquid C to the recess R enables the diameter of the deep portion Rf of the recess R to be expanded. Since the recess R is partially covered with the coating layer Ps, the diameter of the deep portion Rf of the recess R, not covered with the coating layer Ps, is partially expanded. Thus, the diameter of the deep portion Rf of the recess R can be expanded, so that the diameter of the recess R can be adjusted.

Figure 8:
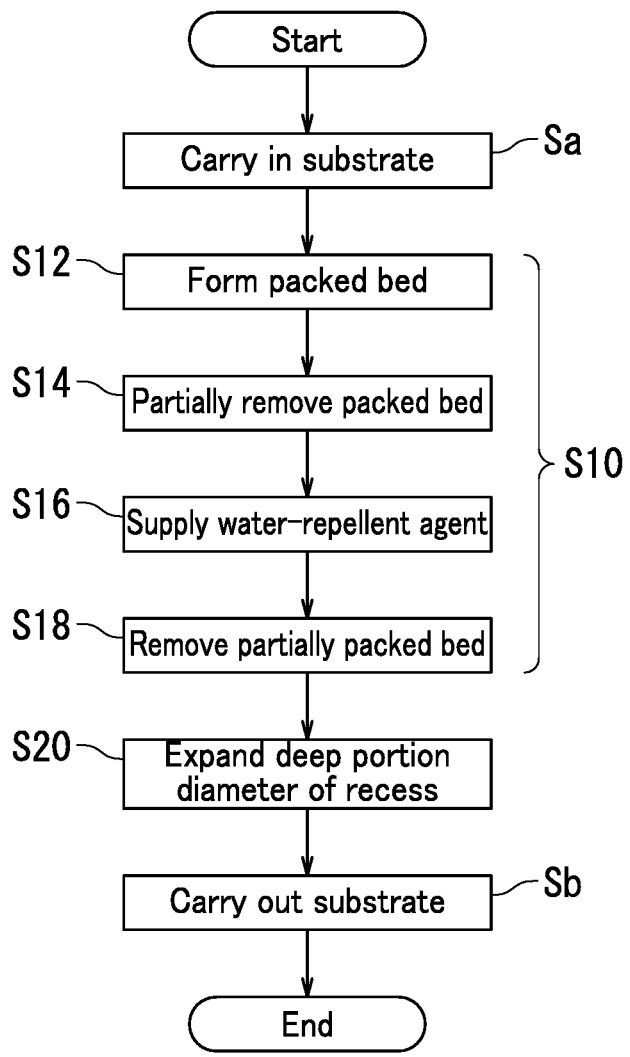
FIG. 8 is a flow chart of the semiconductor device forming method according to the present embodiment.

Next, a semiconductor device forming method according to the present embodiment will be described with reference to FIGS. 1 to 3, 6A to 6G, 7, and 8. FIG. 8 is a flow chart of the semiconductor device forming method. The semiconductor device forming method according to the present embodiment is preferably performed by using the substrate processing apparatus 100 described above with reference to FIGS. 1 to 3.

First, in Step Sa, a substrate W is carried in the substrate processing apparatus 100. Here, the substrate W has a base member S and a stacked structure L, and the stacked structure L is provided with a recess R.

In Step S10, the recess R in the stacked structure L is partially covered. Here, the partial coating of the recess R in Step S10 is performed by formation of a packed bed F in Step S12, the partial removal of the packed bed F in Step S14 (formation of a partially packed bed Fp), and supply of a water-repellent agent in Step S16, and removal of the partially packed bed Fp in Step S18.

In Step S12, the recess R is filled with the packed bed F. The processing liquid supply section 132 supplies the processing liquid to the substrate W. As a result, the recess R of the substrate W is filled with the packed bed F. Typically, after the processing liquid is supplied, the substrate holding section 120 increases the rotation speed of the substrate W and shakes off the excess processing liquid remaining on the surface of the substrate W to the outside of the substrate W.

In Step S14, part of the packed bed F is removed. For example, the removal liquid supply section 134 supplies the removal liquid to the substrate W for a predetermined period of time. When the removal liquid Ds is applied to the packed bed F of the recess R, the packed bed F is partially dissolved to form a partially packed bed Fp in the recess R. The time for applying the removal liquid Ds is set such that the packed bed F of the recess R is partially removed. At this time, the packed bed F of the front surface side portion Rn of the recess R is removed, while the partially packed bed Fp remains in the deep portion Rf of the recess R.

Alternatively, the partially packed bed Fp may be formed in the recess R by heating the packed bed F for a predetermined period. For example, when the packed bed F contains a sublimable substance, the partially packed bed Fp can be formed in the recess R as a result of heating the packed bed F for a predetermined period to sublimate part of the packed bed F.

In Step S16, the water-repellent agent is supplied to the substrate W. The water-repellent agent supply section 136 supplies the water-repellent agent to the substrate W. The water-repellent agent is applied to the recess R in which the partially packed bed Fp is formed in the deep portion Rf, so that the water-repellent agent is filled in the front surface side portion Rn of the recess R in which the partially packed bed Fp is not formed, and a water-repellent layer is formed. At this time, the characteristics of the front surface side portion Rn of the recess R change by the water-repellent agent, and the coating layer Ps is formed in the front surface side portion Rn of the recess R. As described above, by supplying the water-repellent agent, the coating layer Ps is formed as part of the water-repellent layer in the front surface side portion Rn of the recess R.

In Step S18, the partially packed bed Fp is removed. Here, while the portion of the water-repellent layer formed from the water-repellent agent other than the coating layer Ps is removed, the partially packed bed Fp is removed. For example, the removal liquid supply section 134 supplies the removal liquid to the substrate W, thereby dissolving the partially packed bed Fp and also replacing the portion of the water-repellent layer other than the coating layer Ps. At this time, the front surface side portion Rn of the recess R is covered with the coating layer Ps, while the stacked structure L is exposed in the deep portion Rf of the recess R.

Alternatively, the partially packed bed Fp may be removed by heating the partially packed bed Fp for a predetermined period of time. For example, when the packed bed F contains a sublimable substance, the partially packed bed Fp can be removed from the recess R as a result of heating the packed bed F to sublimate part of the packed bed F.

Next, in Step S20, the diameter of the deep portion Rf of the recess is expanded. For example, the chemical liquid supply section 138 supplies the chemical liquid to the substrate W. As a result, the deep portion Rf of the recess R, not covered with the coating layer Ps, is partially etched, and the diameter of the recess is widened.

In Step Sb, the substrate W is carried out from the substrate processing apparatus 100. The coating layer Ps is subsequently removed if necessary. The coating layer Ps may be removed by ashing the coating layer Ps by ultraviolet radiation or heating. As described above, the substrate W in which the fluctuation of the diameter of the recess is suppressed can be formed.

In the above description with reference to FIG. 8, the etching in Step S20 is performed with one type of etching liquid, but the present embodiment is not limited to this. The etching in Step S20 may be performed with a plurality of types of etching liquids. For example, one type of etching liquid may not cause the etching amount of the insulating layers N to equal the etching amount of the sacrificial layers Sa. In this case, the etching in Step S20 is preferably performed with a plurality of types of etching liquids.

Figure 9:
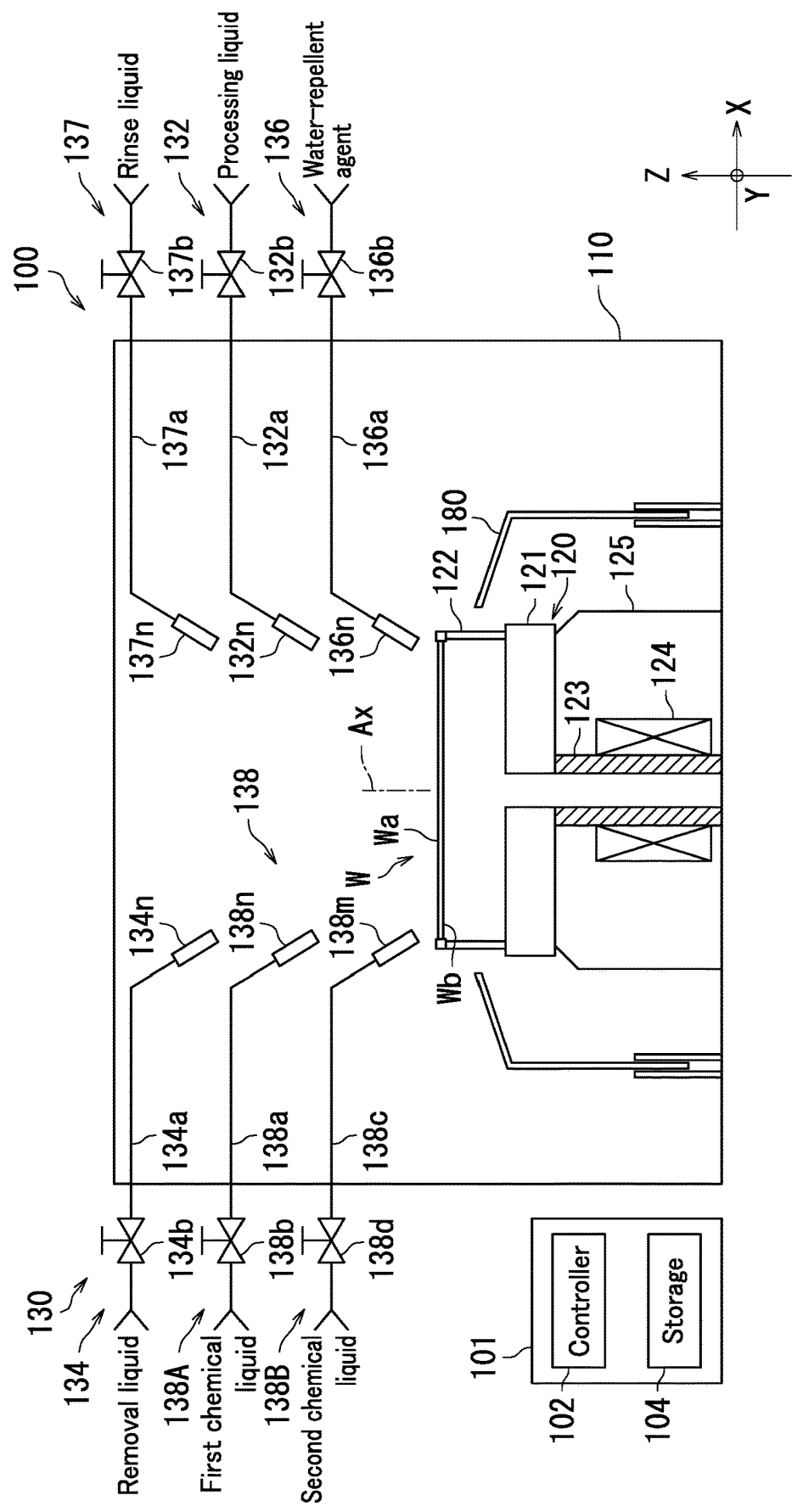
FIG. 9 is a schematic view of a substrate processing apparatus according to the present embodiment.

Next, a semiconductor device forming method according to the present embodiment will be described with reference to FIGS. 1 to 3, 6A to 6G, 9, and 10. FIG. 9 is a schematic view of a substrate processing apparatus 100 according to the present embodiment. The substrate processing apparatus 100 of FIG. 9 has the same configuration as the substrate processing apparatus 100 illustrated in FIG. 2 except that a liquid supply section 130 further includes a rinse liquid supply section 137, and that a chemical liquid supply section 138 includes a first chemical liquid supply section 138A and a second chemical liquid supply section 138B. Duplicate description is omitted in order to avoid redundancy.

In the substrate processing apparatus 100, the liquid supply unit 130 further includes the rinse liquid supply section 137. The rinse liquid supply section 137 supplies a rinse liquid to a substrate W.

The rinse liquid supply section 137 supplies the rinse liquid to an upper surface Wa of the substrate W. Rinsing using the rinse liquid enables a chemical liquid and impurities adhering to the upper surface Wa of the substrate W to be washed away. The rinse liquid supplied from the rinse liquid supply section 137 may contain any of deionized water (DIW), carbonated water, electrolysis ionized water, ozonized water, ammonia water, hydrochloric acid having a diluted concentration (for example, about 10 ppm to 100 ppm), and reduced water (hydrogen water).

The rinse liquid supply section 137 includes a pipe 137a, a valve 137b, and a nozzle 137n. The nozzle 137n discharges the rinse liquid to the upper surface Wa of the substrate W. The nozzle 137n is connected to the pipe 137a. The pipe 137a is supplied with the rinse liquid from a supply source. The valve 137b opens and closes the flow path in the pipe 137a. Preferably, the nozzle 137n is configured to be movable relative to the substrate W.

In the substrate processing apparatus 100, the chemical liquid supply section 138 includes the first chemical liquid supply section 138A and the second chemical liquid supply section 138B. The first chemical liquid supply section 138A supplies a first chemical liquid to the substrate W. The second chemical liquid supply section 138B supplies a second chemical liquid to the substrate W.

The first chemical liquid supply section 138A supplies the first chemical liquid to the upper surface Wa of the substrate W. The upper surface Wa of the substrate W can be treated by a process using the first chemical liquid. The first chemical liquid supply section 138A includes a pipe 138a, a valve 138b, and a nozzle 138n. The nozzle 138n discharges the first chemical liquid to the upper surface Wa of the substrate W. The nozzle 138n is connected to the pipe 138a. The pipe 138a is supplied with the first chemical liquid from a supply source. The valve 138b opens and closes the flow path in the pipe 138a. Preferably, the nozzle 138n is configured to be movable relative to the substrate W.

The second chemical liquid supply section 138B supplies the second chemical liquid to the upper surface Wa of the substrate W. The upper surface Wa of the substrate W can be treated by a process using the second chemical liquid. The second chemical liquid supply section 138B includes a pipe 138c, a valve 138d, and a nozzle 138m. The nozzle 138m discharges the second chemical liquid to the upper surface Wa of the substrate W. The nozzle 138m is connected to the pipe 138c. The pipe 138c is supplied with the second chemical liquid from a supply source. The valve 138d opens and closes the flow path in the pipe 138c. Preferably, the nozzle 138m is configured to be movable relative to the substrate W.

The first chemical liquid is different from the second chemical liquid in etch rate selectivity of sacrificial layers Sa with respect to insulating layers N. For example, when the first chemical liquid has a high etching ratio of the sacrificial layers Sa to the insulating layers N, the second chemical liquid has a low etching ratio of the sacrificial layers Sa to the insulating layers N. In one example, when the first chemical liquid contains hydrofluoric acid, the second chemical liquid preferably contains water or phosphoric acid. As described above, using the first and second chemical liquids different from each other in the etching selectivity of sacrificial layers Sa with respect to insulating layers N enables the etching amount of the insulating layers N to be made equal to the etching amount of the sacrificial layers Sa.

A controller 102 can separately control the valves 137b, 138b, and 138d of the liquid supply section 130 to switch respective states of the valves 137b, 138b, and 138d between the open state and the closed state. Specifically, the controller 102 controls the valves 137b, 138b, and 138d of the liquid supply section 130 and then opens the valves 137b, 138b, and 138d which thereby allow the rinse liquid, the first chemical liquid, and the second chemical liquid flowing in the pipes 137a, 138a and 138c to pass toward the nozzles 137n, 138n, and 138m. The controller 102 also controls the valves 137b, 138b, and 138d of the liquid supply section 130 and then closes the valves 137b, 138b, and 138d which thereby stop the rinse liquid, the first chemical liquid, and the second chemical liquid flowing in the pipes 137a, 138a and 138c from being supplied toward the nozzles 137n, 138n, and 138m.

Figure 10:
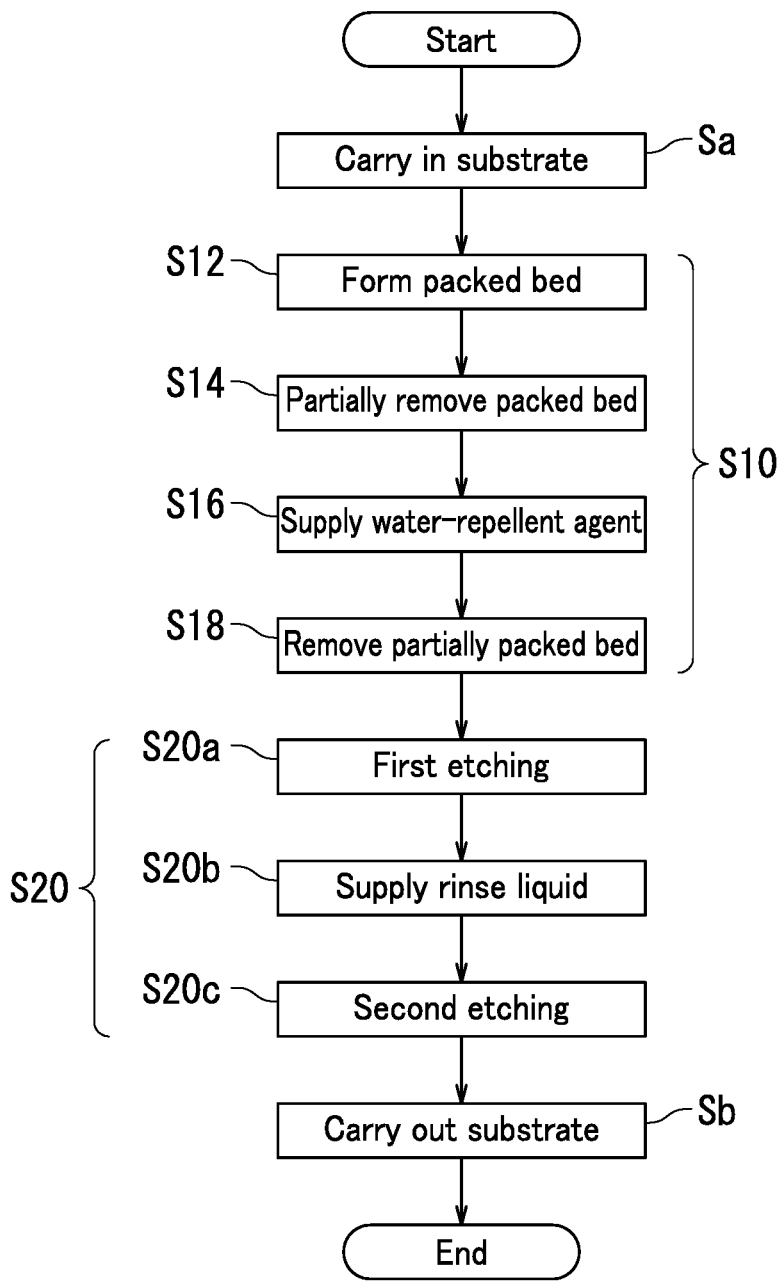
FIG. 10 is a flow chart of a semiconductor device forming method according to the present embodiment.

FIG. 10 is a flow chart of the semiconductor device forming method according to the present embodiment. The flow chart of FIG. 10 is the same as the flow chart of FIG. 8 except that a deep portion Rf of a recess R is etched with a plurality of etching liquids. Duplicate description is omitted to avoid redundancy.

In the present embodiment, etching in Step S20 includes first etching in Step S20a, rinse liquid supply in Step S20b, and second etching in Step S20c. The first etching is different from the second etching in the etching selectivity of the sacrificial layers Sa with respect to the insulating layers N. In a preferable example, when the first etching has a high etching ratio of the sacrificial layers Sa to the insulating layers N, the second etching has a low etching ratio of the sacrificial layers Sa to the insulating layers N.

In Step S20a, the first etching selectively etches first layers of the insulating layers N and the sacrificial layers Sa. For example, the first chemical liquid supply section 138A supplies the first chemical liquid to the upper surface Wa of the substrate W. When, of the insulating layers N and the sacrificial layers Sa, the insulating layers N are selectively etched, hydrofluoric acid is preferably employed as the first chemical liquid. When, of the insulating layers N and the sacrificial layers Sa, the sacrificial layers Sa are selectively etched, warm water or phosphoric acid is preferably employed as the first chemical liquid.

In Step S20b, rinsing is then performed. The rinse liquid supply section 137 supplies the rinse liquid to the upper surface Wa of the substrate W.

In Step S20C, the second etching selectively etches second layers of the insulating layers N and the sacrificial layers Sa. For example, the second chemical liquid supply section 138B supplies the second chemical liquid to the upper surface Wa of the substrate W. When the first etching selectively etches the first layers of the insulating layers N and the sacrificial layers Sa, the second etching selectively etches the second layers of the insulating layers N and the sacrificial layers Sa. As described above, etching at two different selection ratios enables the etching amount of the insulating layers N to equal the etching amount of the sacrificial layers Sa.

As described above with reference to FIGS. 2, 6A to 6G and 7, the packed bed F is formed as a result of the processing liquid supply section 132 supplying the processing liquid to the substrate W. When the processing liquid contains a solute and a volatile solvent, the processing liquid supply section 132 preferably supplies the processing liquid to the substrate W and then heats the processing liquid. Heating the processing liquid enables the packed bed F to be formed quickly.

Figure 11:
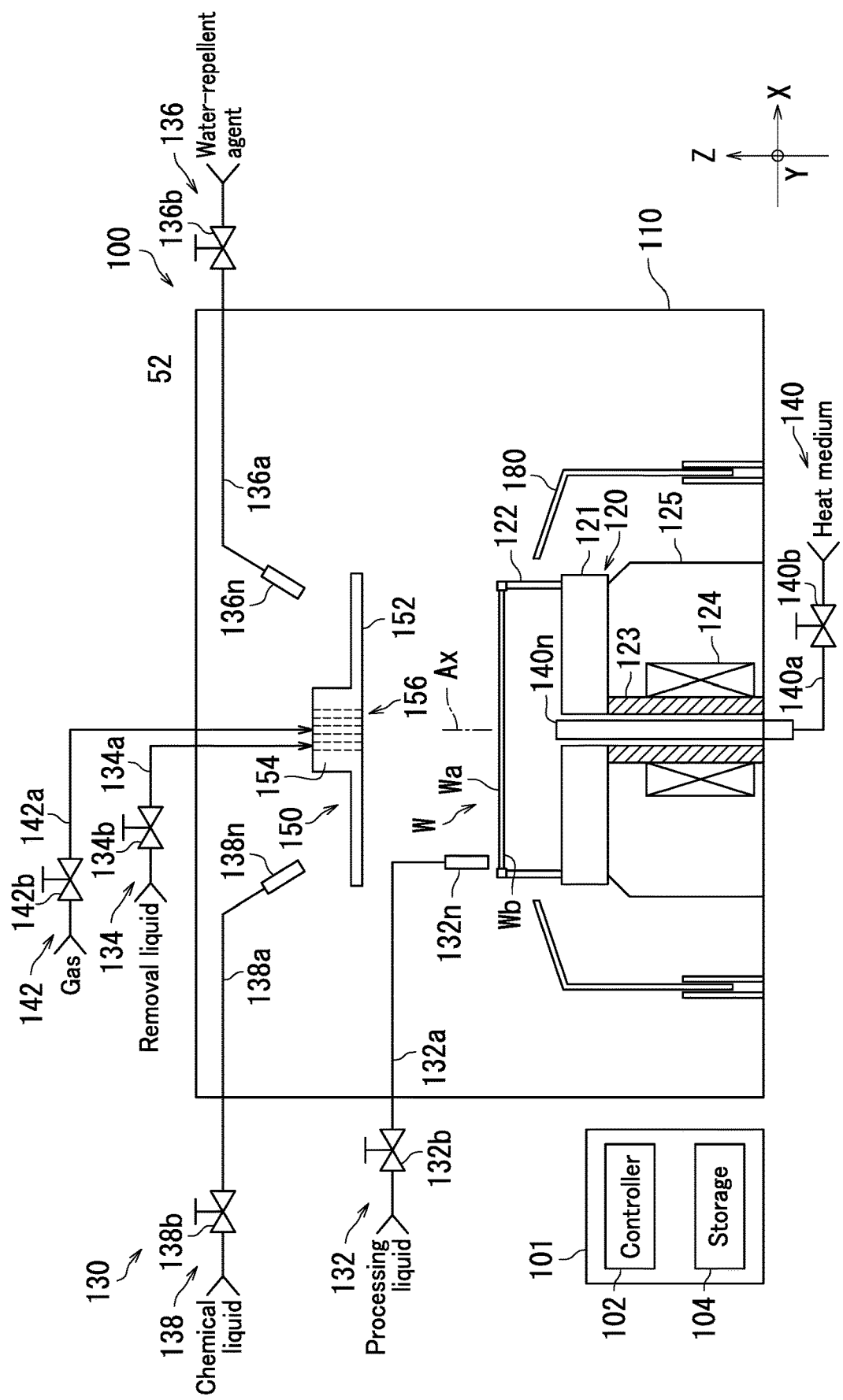
FIG. 11 is a schematic view of a substrate processing apparatus according to the present embodiment.

Next, a semiconductor device forming method according to the present embodiment will be described with reference to FIGS. 11 and 12. FIG. 11 is a schematic view of a substrate processing apparatus 100 according to the present embodiment. The substrate processing apparatus 100 of FIG. 11 has the same configuration as the substrate processing apparatus 100 illustrated in FIG. 2 except that a heat medium supply section 140, a gas supply unit 142, and a shielding member 150 are further provided. Duplicate description is omitted to avoid redundancy.

The substrate processing apparatus 100 further includes the heat medium supply section 140, the gas supply unit 142, and the shielding member 150. The heat medium supply section 140 supplies a heat medium to a substrate W. The gas supply unit 142 supplies a gas to the substrate W. The shielding member 150 shields the substrate W from the vertically upper side.

A processing liquid supply section 132 supplies a processing liquid containing a solute and a volatile solvent. A packed bed F is formed from solute components.

The heat medium supplied by the heat medium supply section 140 may be either a liquid or a gas. For example, the heat medium is warm water. While or after the processing liquid supply section 132 supplies the processing liquid to an upper surface Wa of the substrate W, the heat medium supply section 140 heats the substrate W held by a spin base 121 and a chuck member 122 from a lower surface Wb side of the substrate W, so that the packed bed is formed on the upper surface Wa of the substrate W.

When the substrate W is rotating, the heat medium supply section 140 supplies the heat medium toward the center position of the lower surface Wb of the substrate W. The supplied heat medium spreads over substantially the entire lower surface Wb of the substrate W by the action of centrifugal force. As a result, since the substrate W and the processing liquid on the upper surface Wa of the substrate W are heated, the solvent is volatilized from the processing liquid, and a packed bed is rapidly formed.

The heat medium supply section 140 includes a pipe 140a, a valve 140b, and a nozzle 140n. The nozzle 140n faces the lower surface Wb of the substrate W. The nozzle 140n discharges the heat medium to the lower surface Wb of the substrate W. The nozzle 140n is connected to the pipe 140a. The pipe 140a is supplied with the heat medium from a supply source. The valve 140b opens and closes the flow path in the pipe 140a.

The gas supply unit 142 supplies a gas to the upper surface Wa of the substrate W. The gas supplied by the gas supply unit 142 preferably contains an inert gas. The inert gas includes nitrogen gas.

The gas supply unit 142 includes a pipe 142a and a valve 142b. The pipe 142a is supplied with the gas from a supply source. The valve 142b opens and closes the flow path in the pipe 142a.

The shielding member 150 is placed above a substrate holding section 120. The shielding member 150 faces the substrate W. Here, the outer diameter of at least part, in the horizontal direction, of the shielding member 150 substantially equals the outer diameter of the substrate W.

The shielding member 150 moves relative to the substrate W between a proximity position and a retracted position. When the shielding member 150 moves to the proximity position, the shielding member 150 descends and then approaches the upper surface of the substrate W at a predetermined interval. At the proximity position, the shielding member 150 covers the front surface of the substrate W and shields the upper part of the substrate W. When the shielding member 150 is in the retracted position, the shielding member 150 is in a position vertically above the proximity position. When the shielding member 150 moves from the proximity position to the retracted position, the shielding member 150 rises and separates from the substrate W.

The shielding member 150 includes a shielding plate 152, a support shaft 154, and a nozzle 156. The support shaft 154 is located on the line of a rotation axis Ax of a shaft 123. The shielding plate 152 extends horizontally from the support shaft 154. Here, the shielding plate 152 has a shape extending in the horizontal direction. For example, the shielding plate 152 has a substantially disk shape.

The nozzle 156 is connected with a pipe 134a of a removal liquid supply section 134 and the pipe 142a of the gas supply unit 142. The nozzle 156 functions as nozzles of the removal liquid supply section 134 and the gas supply unit 142.

A controller 102 can separately control the valves 140b and 142b to switch respective states of the valves 140b and 142b between the open state and the closed state. Specifically, the controller 102 controls the valves 140b and 142b to open the valves 140b and 142b which thereby allow the heat medium and the gas flowing in the pipes 140a and 142a to pass toward the nozzles 140n and 156. The controller 102 also controls the valves 140b and 142b to close the valves 140b and 142b which thereby stop the heat medium and the gas flowing in the pipes 140a and 142a from being supplied toward the nozzles 140n and 156.

The controller 102 also controls the shielding member 150 and then moves the shielding member 150 relative to the substrate W between the proximity position and the retracted position.

Figure 12:
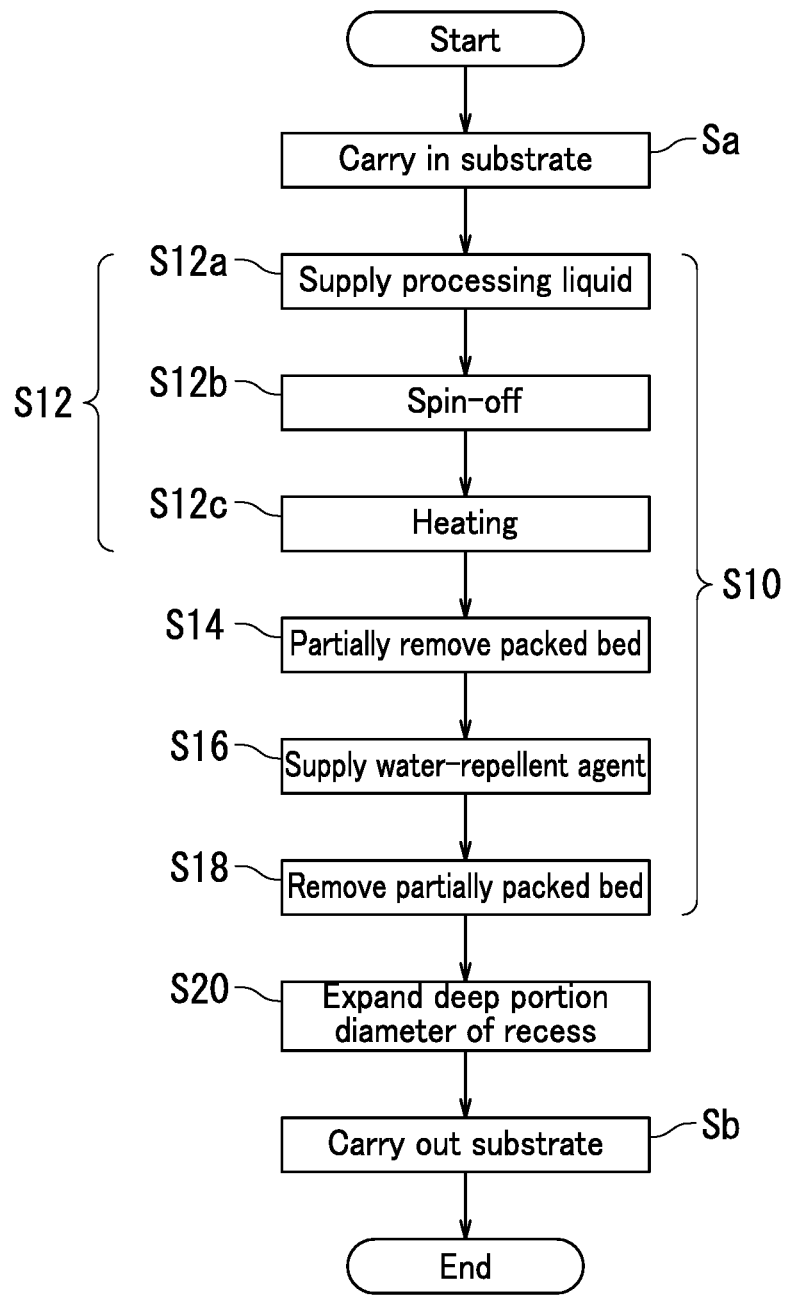
FIG. 12 is a flow chart of a semiconductor device forming method according to the present embodiment.

FIG. 12 is a flow chart of the semiconductor device forming method according to the present embodiment. The flow chart of FIG. 12 is similar to the flow chart of FIG. 8 except that the packed bed F is formed through a plurality of steps. Duplicate description is omitted to avoid redundancy.

Formation of the packed bed F in Step S12 includes supply of the processing liquid in Step S12a, spin-off in Step S12b, and heating in Step S12c.

In Step S12a, the processing liquid is supplied. The processing liquid supply section 132 supplies the processing liquid to the upper surface Wa of the substrate W. At this time, the rotation speed of the substrate W is 10 rpm to 100 rpm.

In Step S12b, the substrate holding section 120 is supplied with the processing liquid, and then increases the rotation speed of the substrate W to spin off the processing liquid on the upper surface Wa of the substrate W. For example, the rotation speed of the substrate W is increased to 300 rpm to 1500 rpm.

In Step S12c, the heat medium supply section 140 supplies the heat medium to the lower surface Wb of the substrate W. For example, after the processing liquid is spun off, the rotation speed of the substrate W is reduced to 100 rpm to 1000 rpm. Heating the processing liquid on the upper surface Wa of the substrate W enables the packed bed F to be quickly formed from the processing liquid.

In the description with reference to FIGS. 11 and 12, the processing liquid is heated by the heat medium supplied from the heat medium supply section 140, but the present embodiment is not limited to this. A heat source such as a lamp or an electric heater may be installed in the substrate processing apparatus 100, and the processing liquid may be heated by utilizing heat from the heat source.

Preferably, a stripping liquid is supplied to the substrate W before a removal liquid for removing the packed layer F and/or a partially packed layer Fp is supplied.

Figure 13:
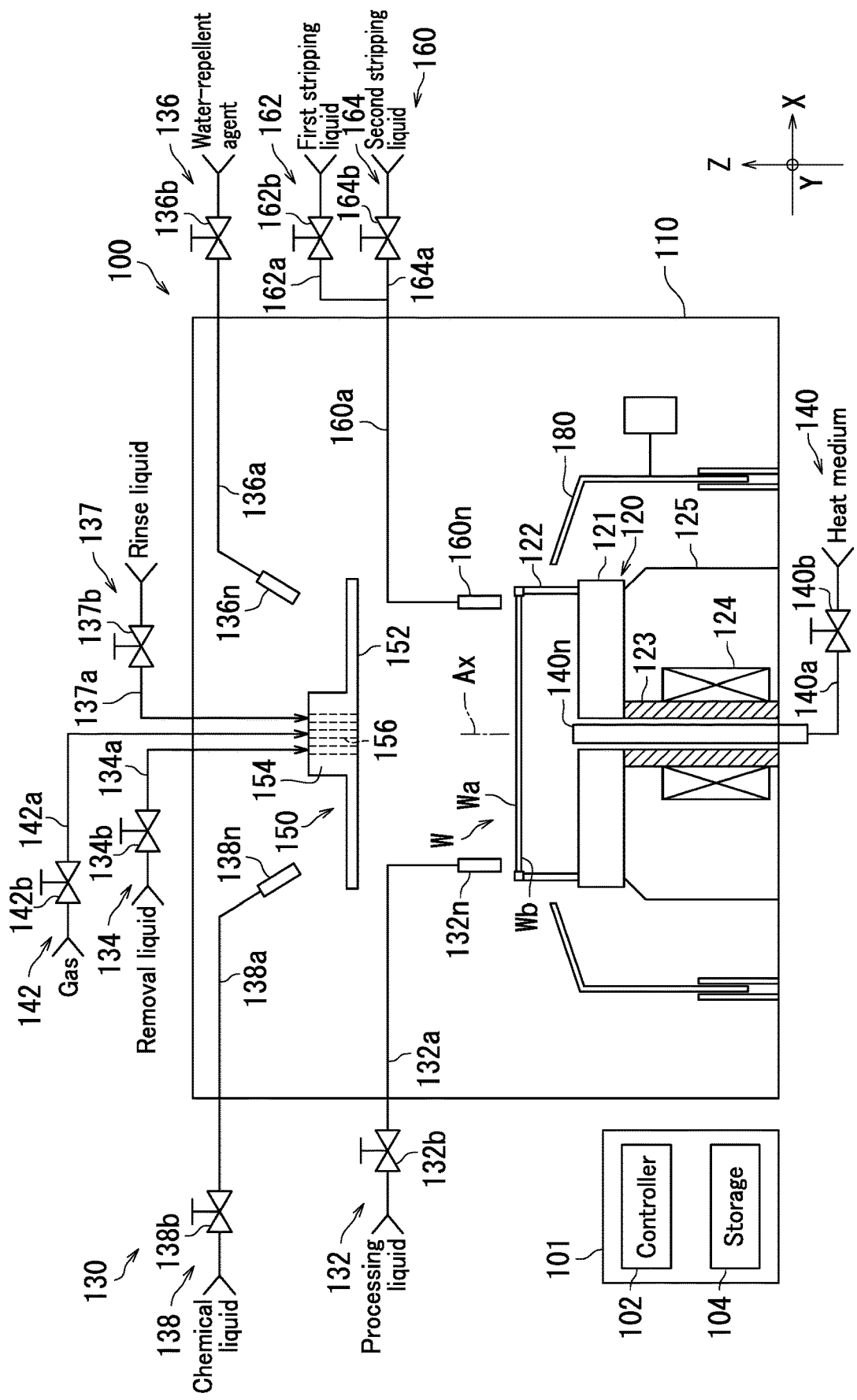
FIG. 13 is a schematic view of a substrate processing apparatus according to the present embodiment.

Next, a semiconductor device forming method according to the present embodiment will be described with reference to FIGS. 6A to 6G, 13 and 14. FIG. 13 is a schematic view of a substrate processing apparatus 100 according to the present embodiment. The substrate processing apparatus 100 of FIG. 13 has the same configuration as the substrate processing apparatus 100 illustrated in FIG. 11 except that a liquid supply section 130 further includes a rinse liquid supply section 137 and a stripping liquid supply section 160. Duplicate description is omitted to avoid redundancy.

In the substrate processing apparatus 100 according to the present embodiment, the liquid supply section 130 further includes the rinse liquid supply section 137 and the stripping liquid supply section 160. The rinse liquid supply section 137 supplies a rinse liquid to a substrate W. The stripping liquid supply section 160 supplies a stripping liquid to the substrate W.

The rinse liquid supply section 137 supplies the rinse liquid to the substrate W. The rinse liquid supply section 137 includes a pipe 137a and a valve 137b. The pipe 137a is supplied with the rinse liquid from a supply source. The valve 137b opens and closes the flow path in the pipe 137a.

The pipe 137a of the rinse liquid supply section 137 is connected to a nozzle 156 of a shielding member 150. The nozzle 156 functions as a nozzle of the rinse liquid supply section 137.

The stripping liquid supply section 160 supplies the stripping liquid to an upper surface Wa of the substrate W. The stripping liquid has a stripping property with respect to a packed bed F. By supplying the stripping liquid, the packed bed F can be easily stripped thereafter. For example, the stripping liquid contains DIW and/or SC1. Controlling the processing time and the concentration of the stripping liquid to be supplied by the stripping liquid supply section 160 enables a partially packed bed Fp to be appropriately formed from the packed bed F.

Here, the stripping liquid supply section 160 includes a first stripping liquid supply section 162 and a second stripping liquid supply section 164. The first stripping liquid supply section 162 supplies a first stripping liquid to the upper surface Wa of the substrate W. The second stripping liquid supply section 164 supplies a second stripping liquid to the upper surface Wa of the substrate W. The first stripping liquid supply section 162 supplies the upper surface Wa of the substrate W with a stripping liquid that is different from a stripping liquid the second stripping liquid supply section 164 supplies.

The first stripping liquid supply section 162 includes a pipe 162a and a valve 162b. The pipe 162a is supplied with the first stripping liquid from a supply source. The valve 162b opens and closes the flow path in the pipe 162a.

The second stripping liquid supply section 164 includes a pipe 164a and a valve 164b. The pipe 164a is supplied with the second stripping liquid from a supply source. The valve 164b opens and closes the flow path in the pipe 164a.

The stripping liquid supply section 160 further includes a pipe 160a and a nozzle 160n. The pipe 160a is connected to the pipe 162a and the pipe 164a. The nozzle 160n discharges the stripping liquid to the upper surface Wa of the substrate W. The nozzle 160n is connected to the pipe 160a. Preferably, the nozzle 160n is configured to be movable relative to the substrate W.

The controller 102 can separately control the valves 162b and 164b of the stripping liquid supply section 160 and then switches respective states of the valves 162b and 164b between the open state and the closed state. Specifically, the controller 102 controls the valves 162b and 164b of the stripping liquid supply section 160 to open the valve 162b or the valve 164b which thereby allows the first stripping liquid or the second stripping liquid flowing in the pipe 160a and a pipe 162a or 164a to pass toward the nozzle 160n. The controller 102 also controls the valves 162b and 164b of the stripping liquid supply section 160 to close the valves 162b and 164b which thereby stop the first stripping liquid and the second stripping liquid to flow in the pipe 160a and the pipes 162a and 164a from being supplied toward the nozzle 160n.

When the processing liquid contains a thermo-induced water-soluble resin as a solute, a heat medium having a boiling point lower than a change-of-state temperature is preferably employed as a heat medium, in order to keep the temperature of the thermo-induced water-soluble resin below the change-of-state temperature when the processing liquid is heated. For example, when the thermo-induced water-soluble resin has a change-of-state temperature of 180° C., DIW (boiling point: 100° C.) or the like may be employed as the heat medium. The temperature of the heat medium is more preferably set to a temperature lower than the boiling point of the solvent. Setting the temperature of the processing liquid to a temperature lower than the boiling point of the solvent enables the solvent to remain in the packed bed. Then, the packed bed can be easily stripped from the upper surface of the substrate W by the interaction between the solvent remaining in the packed bed and the stripping liquid.

Figure 14:
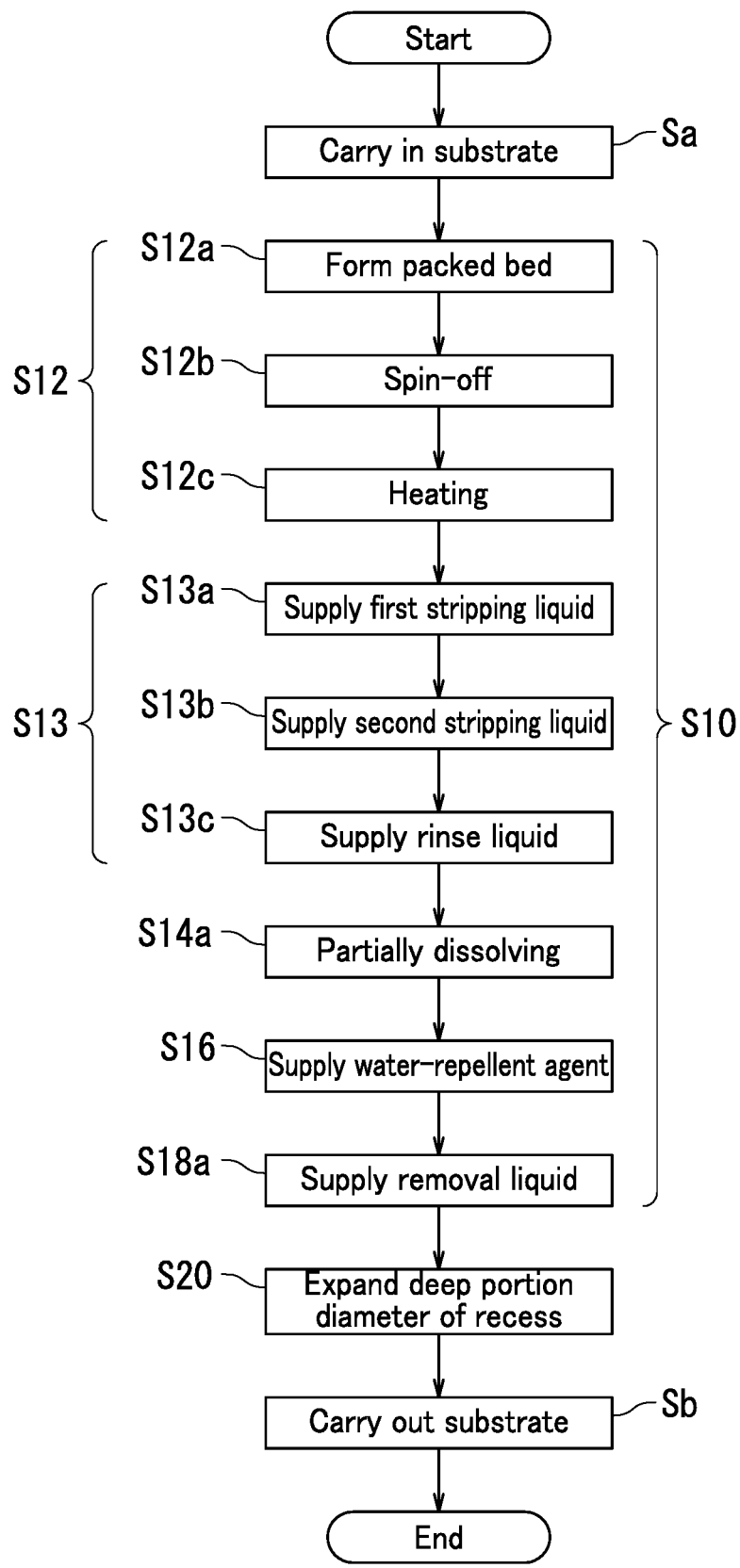
FIG. 14 is a flow chart of a semiconductor device forming method according to the present embodiment.

FIG. 14 is a flow chart of the semiconductor device forming method according to the present embodiment. The flow chart of FIG. 14 is similar to the flow chart of FIG. 12 except that a removal liquid is supplied to remove the packed bed and the partially packed bed and the stripping liquid is supplied before the removal liquid is supplied. Duplicate description is omitted to avoid redundancy.

In Step S13a, the first stripping liquid is supplied after the substrate W is heated in Step S12c. The first stripping liquid supply section 162 supplies the first stripping liquid to the substrate W. For example, the first stripping liquid supply section 162 supplies DIW as the first stripping liquid.

In Step S13b, the second stripping liquid is supplied. The second stripping liquid supply section 164 supplies the second stripping liquid to the substrate W. For example, the second stripping liquid supply section 164 supplies SC1 as the second stripping liquid.

In Step S13c, the rinse liquid is supplied. For example, the rinse liquid supply section 137 supplies the rinse liquid to the upper surface Wa of the substrate W.

Then, in Step S14a, the packed bed F is partially dissolved by the removal liquid to form the partially packed bed Fp. A removal liquid supply section 134 supplies the removal liquid to the substrate W for a predetermined period of time. When the removing liquid Ds is applied to the packed bed F of the recess R, the packed bed F is partially dissolved to form the partially packed bed Fp in the recess R. The partially packed bed Fp can be appropriately formed from the packed bed F by controlling a concentration and a processing time with respect to each of the first stripping liquid, the second stripping liquid, and the removal liquid to be supplied by the first stripping liquid supply section 162, the second stripping liquid supply section 164, and the removal liquid supply section 134.

In Step S18a, the removal liquid is supplied to remove a water-repellent agent P excluding a coating layer Ps and the partially packed bed Fp, after the water-repellent agent is supplied in Step S16. Subsequently, similar processing is performed.

In the flow chart illustrated in FIG. 14, the first stripping liquid and the second stripping liquid are supplied before the packed bed F is partially dissolved by the removal liquid, but the present embodiment is not limited to this. The first stripping liquid and the second stripping liquid may be supplied not only before the packed bed F is partially dissolved but also before the partially packed bed Fp is dissolved. Alternatively, the first stripping liquid and the second stripping liquid may be supplied not before the packed bed F is partially dissolved, but before the partially packed bed Fp is dissolved.

In the flow chart illustrated in FIG. 14, the first stripping liquid and the second stripping liquid are supplied, but the present embodiment is not limited to this. Only one of the first stripping liquid and the second stripping liquid may be supplied before the packed bed F and/or the partially packed bed Fp are/is dissolved.

In the above description with reference to FIGS. 13 and 14, the packed bed F and/or the partially packed bed Fp are/is removed by the stripping liquid and/or the removal liquid, but the present embodiment is not limited to this. The packed bed F and/or the partially packed bed Fp may be removed by heating.

Figure 15:
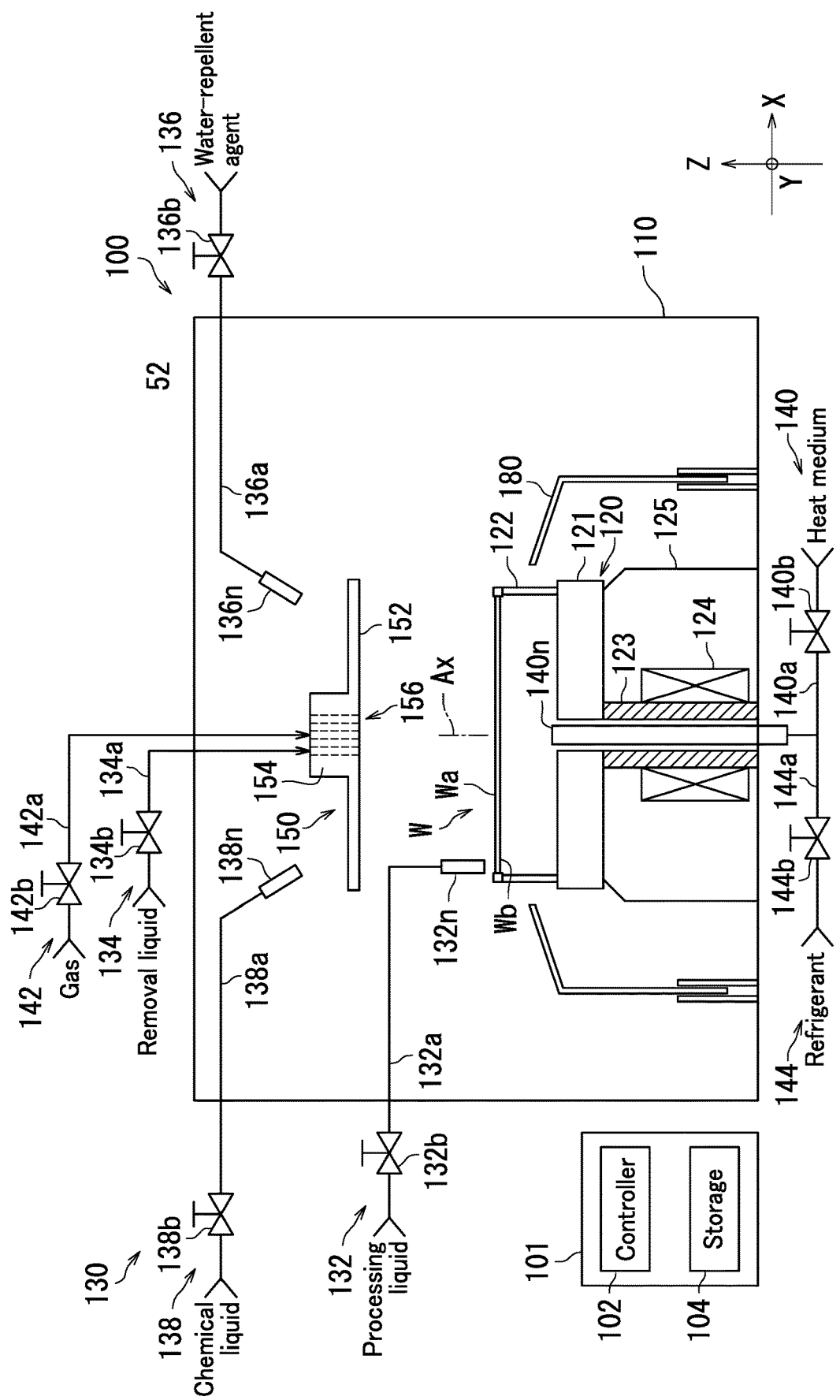
FIG. 15 is a schematic view of a substrate processing apparatus according to the present embodiment.

Next, a semiconductor device forming method according to the present embodiment will be described with reference to FIGS. 6A to 6G, 15 and 16. FIG. 15 is a schematic view of a substrate processing apparatus 100 according to the present embodiment. The substrate processing apparatus 100 of FIG. 15 has the same configuration as the substrate processing apparatus 100 illustrated in FIG. 11 except that a processing liquid contains a sublimable substance and a packed bed formed from the processing liquid is cooled. Duplicate description is omitted to avoid redundancy.

In the present embodiment, a processing liquid supply section 132 supplies the processing liquid containing the sublimable substance to an upper surface Wa of a substrate W. When the sublimable substance is mixed in a melted state, it is desirable that a solvent of the processing liquid be a solvent exhibiting compatibility with the sublimable substance in the melted state. When a sublimable substance as a solute is dissolved, it is desirable for the solvent to be soluble in the sublimable substance.

The substrate processing apparatus 100 further includes a refrigerant supply section 144. The refrigerant supply section 144 supplies the substrate W with a refrigerant whose temperature is lower than room temperature. The refrigerant is, for example DIW cooled below room temperature.

The refrigerant supplied by the refrigerant supply section 144 may be either a liquid or a gas. After a processing liquid supply section 132 supplies the processing liquid to the upper surface Wa of the substrate W, the refrigerant supply section 144 cools the substrate W held by a spin base 121 and a chuck member 122 from a lower surface Wb side of the substrate W.

When the substrate W is rotating, the refrigerant supply section 144 supplies the refrigerant toward the center position of the lower surface Wb of the substrate W. The supplied refrigerant spreads over substantially the entire lower surface Wb of the substrate W by the action of centrifugal force. As a result, the substrate W and the processing liquid on the upper surface Wa of the substrate W are cooled and solidified, and a packed bed can be quickly formed from the processing liquid.

The refrigerant supply section 144 includes a pipe 144a and a valve 144b. The pipe 144a is supplied with the refrigerant from a supply source. The valve 144b opens and closes the flow path in the pipe 144a. The pipe 144a is connected to a pipe 140a of a heat medium supply section 140. The refrigerant is supplied to the lower surface Wb of the substrate W from a nozzle 140n of the heat medium supply section 140.

The substrate processing apparatus 100 includes the heat medium supply section 140 in addition to the refrigerant supply section 144. The heat medium supply section 140 supplies a heat medium to the lower surface Wb of the substrate W until right before the refrigerant supply section 144 supplies the refrigerant to the lower surface Wb of the substrate W, so that the packed bed F can be thinly formed. Therefore, the internal stress generated in the packed bed F can be reduced.

Figure 16:
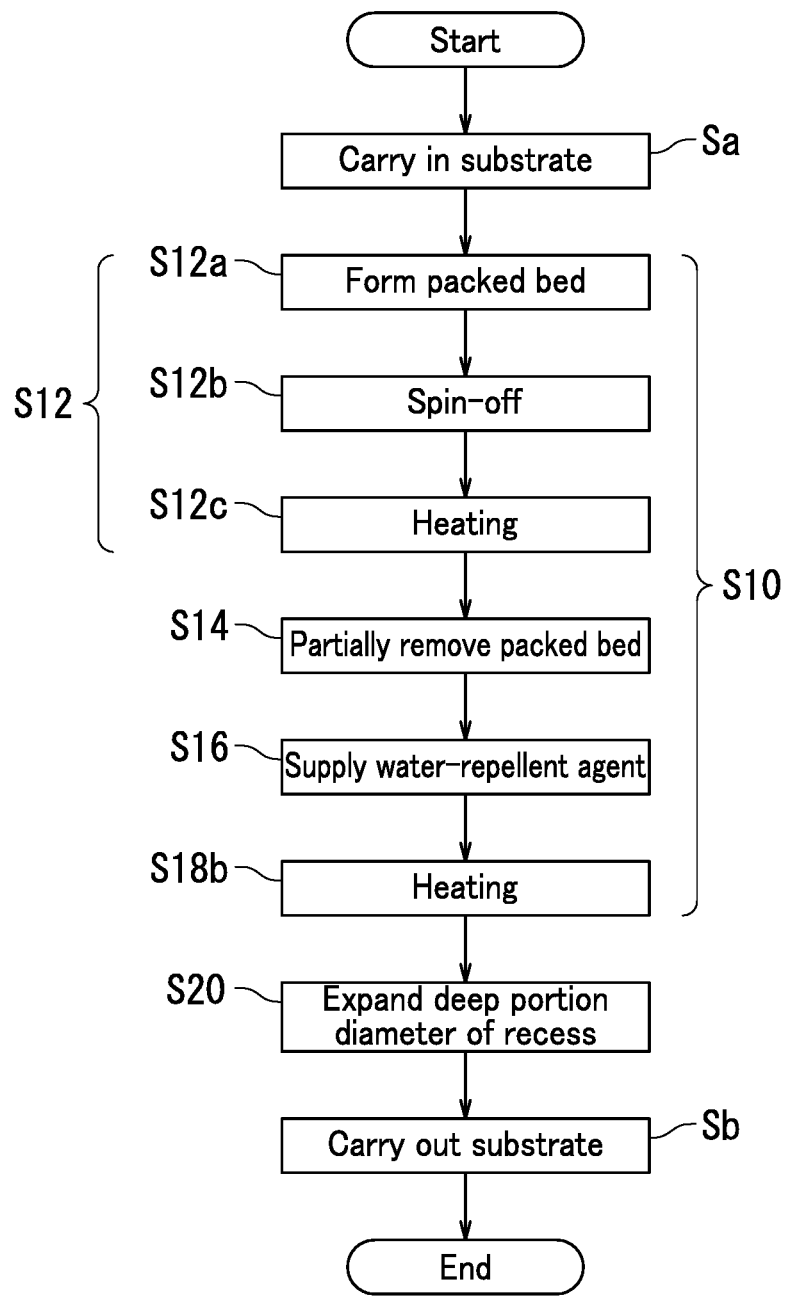
FIG. 16 is a flow chart of a semiconductor device forming method according to the present embodiment.

FIG. 16 is a flow chart of the semiconductor device forming method according to the present embodiment. The flow chart of FIG. 16 is the same as the flow chart of FIG. 8 except that the processing liquid contains a sublimable substance and that a partially packed bed is heated when being removed. Duplicate description is omitted to avoid redundancy.

In Step S12, the packed bed F is formed. The processing liquid supply section 132 supplies the processing liquid to the substrate W. Here, the processing liquid contains the sublimable substance. The processing liquid supply section 132 supplies the processing liquid containing the sublimable substance to the upper surface Wa of the substrate W.

The refrigerant supply section 144 supplies the refrigerant to the lower surface Wb of the substrate W when forming the packed bed F. As a result, the processing liquid solidifies to form the packed bed F. The refrigerant supplied to the lower surface Wb of the substrate W is distributed over substantially the entire lower surface Wb of the substrate W by the action of centrifugal force. Cooling of the processing liquid is started on the upper surface Wa of the substrate W.

In Step 18b, the partially packed bed Fp is removed. Meanwhile, the refrigerant supply section 144 stops supplying the refrigerant and the heat medium supply section 140 starts supplying the heat medium. Accordingly, the partially packed bed Fp is sublimated, so that the partially packed bed Fp can be removed.

In the above description with reference to FIGS. 1 to 16, the substrate processing apparatus 100 is of a single-wafer type, and processes the substrates W one by one, but the present invention is not limited thereto. The substrate processing apparatus may be of a batch type.

Figure 17:
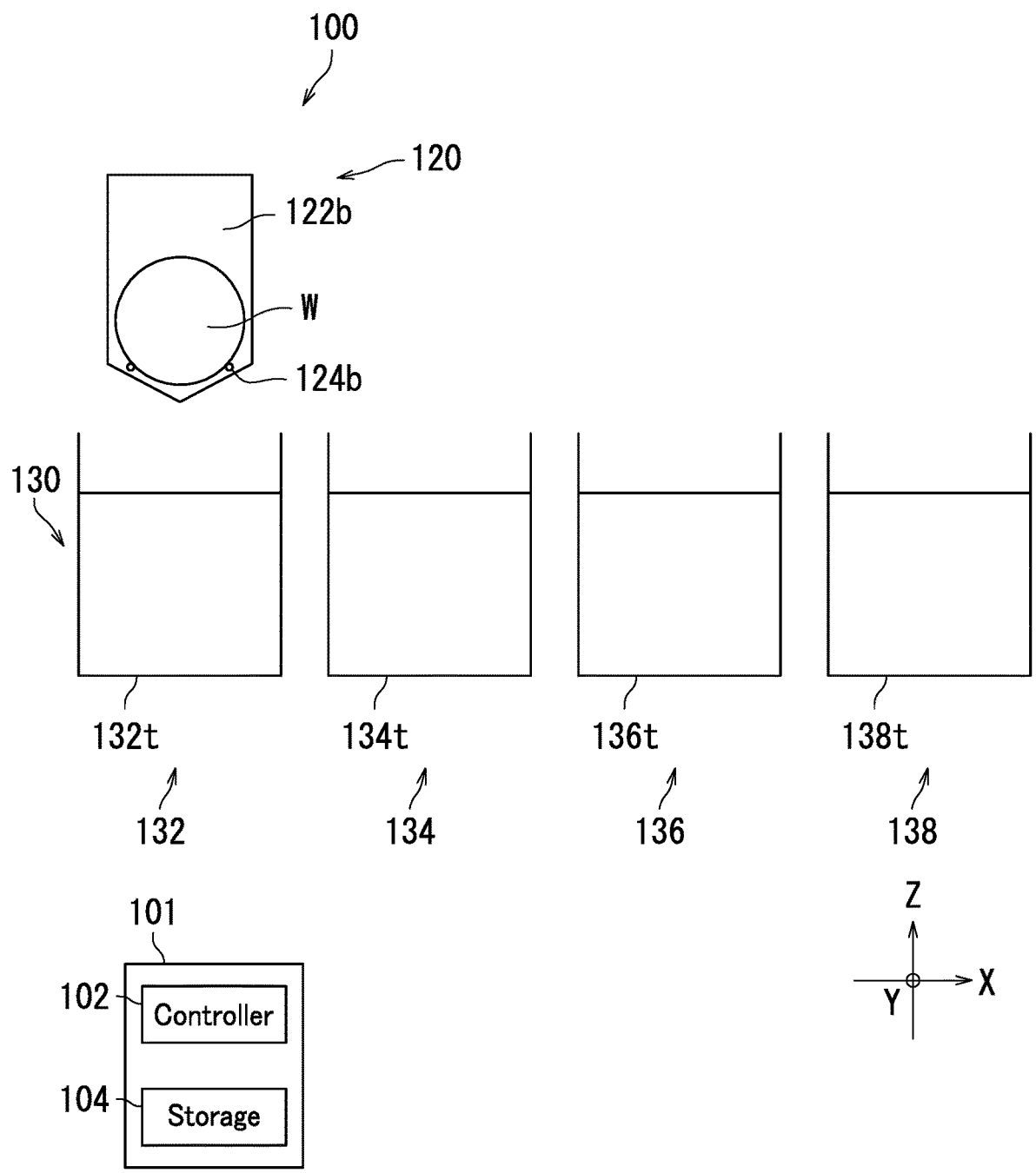
FIG. 17 is a schematic view of a substrate processing apparatus according to the present embodiment.

Next, a substrate processing apparatus 100 according to the present embodiment will be described with reference to FIG. 17. FIG. 17 is a schematic diagram of the substrate processing apparatus 100. The substrate processing apparatus 100 can process a plurality of substrates W together.

The substrate processing apparatus 100 includes a substrate holding section 120 and a liquid supply section 130. The liquid supply section 130 includes a processing liquid supply section 132, a removal liquid supply section 134, a water-repellent agent supply section 136, and a chemical liquid supply section 138. Each of the processing liquid supply section 132, the removal liquid supply section 134, the water-repellent agent supply section 136, and the chemical liquid supply section 138 stores a liquid.

The processing liquid supply section 132 includes a processing liquid reservoir 132t. The processing liquid reservoir 132t stores a processing liquid. A packed bed is formed from the processing liquid. For example, the processing liquid contains a solute and a volatile solvent. Alternatively, the processing liquid contains a sublimable substance.

The removal liquid supply section 134 includes a removal liquid reservoir 134t. The removal liquid reservoir 134t stores a removal liquid. The removal liquid enables the packed bed formed from the processing liquid to be removed. The packed bed can be selectively removed from the substrate W by controlling the time for supplying the removal liquid.

Any solvents that are soluble in specific resins can be employed as the removal liquid. Examples of the removal liquid include organic solvents such as thinner, toluene, ester acetates, alcohols, and glycols as well as acid liquids such as acetic acids, formic acids, and hydroxyacetic acids.

The water-repellent agent supply section 136 includes a water-repellent agent reservoir 136t. The water-repellent agent reservoir 136t stores a water-repellent agent in the form of a liquid. The water-repellent agent forms a water-repellent layer on the substrate W. The water-repellent agent is a water-repellent agent that causes silicon (Si) itself and a compound containing silicon to be hydrophobic. The water-repellent agent is, for example a silane coupling agent. One example of the silane coupling agent includes at least one of compounds including hexamethyldisilazane (HMDS), tetramethylsilane (TMS), fluorinated alkylchlorosilane, alkyl disilazane, and non-chloro water-repellent agent. For example, the non-chloro water-repellent agent includes at least one of compounds including dimethylsilyl-dimethylamine, dimethylsilyl-diethylamine, hexamethyl disilazane, tetramethyl disilazane, bis (dimethylamino) dimethylsilane, N, N-dimethylaminotrimethylsilane, N-(trimethylsilyl) dimethylamine, and organosilane compound.

The chemical liquid supply section 138 includes a chemical liquid reservoir 138t. The chemical liquid reservoir 138t stores a chemical liquid. The substrate W can be treated by a process using the chemical liquid. The process using the chemical liquid enables the substrate W to be treated by any of etching, surface treatment, property imparting, treatment film formation, and removal of at least partial film. Typically, the chemical liquid is an etching liquid used for etching the substrate W.

The chemical liquid contains hydrofluoric acid. For example, hydrofluoric acid may be heated to 40° C. or higher and 70° C. or lower, or 50° C. or higher and 60° C. or lower. However, hydrofluoric acid does not have to be heated. The chemical liquid may also contain water or phosphoric acid.

The chemical liquid may further contain a hydrogen peroxide solution. The chemical liquid may contain ammonia-hydrogen peroxide mixture (SC1), hydrochloric acid-hydrogen peroxide mixture (SC2), or a mixture of concentrated hydrochloric acid and concentrated nitric acid (aqua regia).

The substrate holding section 120 holds the substrate W. The normal direction that is perpendicular to a main surface of the substrate W held by the substrate holding section 120 is parallel to the Y direction. The substrate holding section 120 moves the substrates W while holding the substrates W. For example, the substrate holding section 120 moves vertically upward or vertically downward while holding the substrates W. Alternatively, the substrate holding section 120 may move in the horizontal direction while holding the substrates W.

The substrate holding section 120 includes a body plate 122b and holding rods 124b. The body plate 122b is a plate extending in the vertical direction (Z-direction). The holding rods 124b extend in the horizontal direction (Y-direction) from one main surface of the body plate 122b. Here, two holding rods 124b extend in the Y-direction from one main surface of the body plate 122b. The holding rods 124b hold the substrates W in an upright posture (vertical posture) while being in contact with respective lower edges of the substrates W in a state where the substrates W are arranged in the front direction from the back of the paper surface.

The substrate processing apparatus 100 further includes a control device 101. The control device 101 includes a controller 102 and storage 104. The controller 102 controls the substrate holding section 120.

In the substrate processing apparatus 100 according to the present embodiment, like the single-wafer type, the controller 102 processes the substrates W held by the substrate holding section 120 with a different liquid. As a result, the diameter of the recess provided in a stacked structure L of each substrate W can be adjusted in the same way as the single-wafer type described with reference to FIGS. 6A to 16.

In the description with reference to FIGS. 1 to 17, the memory cells Se are arranged in the recess R of the substrate W, but the present embodiment is not limited to this. Dummy memory cells which have the same configuration as the memory cells Se but are not used as the memory cells may be formed in the recess R of the substrate W. Alternatively, contact plugs to be electrically connected with the memory cells Se may be formed in the recess R of the substrate W.

Figure 18:
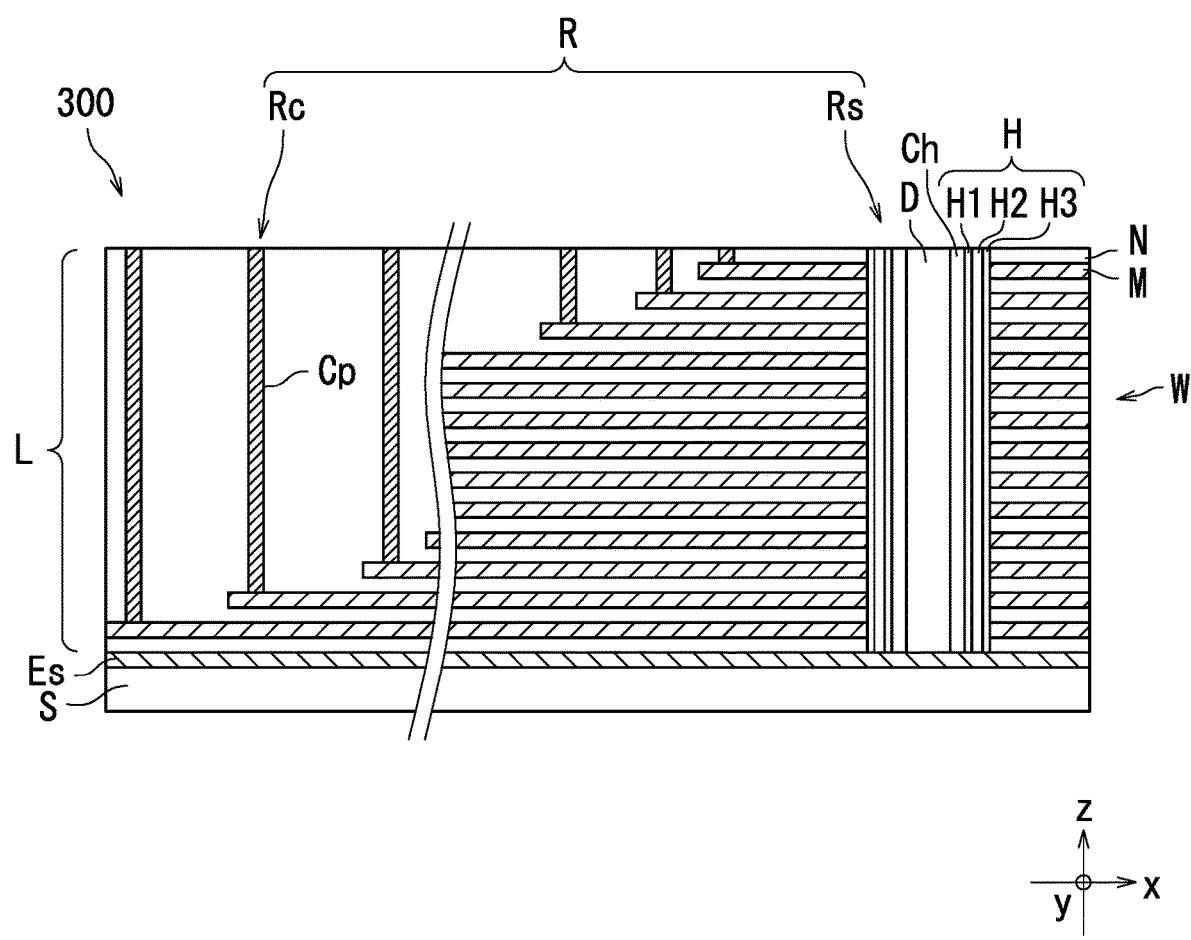
FIG. 18 is a schematic diagram of a semiconductor device formed by a semiconductor device forming method according to the present embodiment.

Next, a semiconductor device 300 formed by a semiconductor device forming method according to the present embodiment will be described with reference to FIG. 18. FIG. 18 is a schematic diagram of the semiconductor device 300.

The semiconductor device 300 is provided with a plurality of recesses R. The recesses R include a contact recess Rc in which contact plugs Cp are arranged in addition to a memory recess Rs in which memory cells Se are arranged. The contact recess Rc is electrically connected to conductive layers M.

The semiconductor device forming method according to the present embodiment enables not only the diameter of the memory recess Rs but also the diameter of the contact recess Rc to be made uniform from the front surface portion to the deep portion. Therefore, the strength of supporting the semiconductor device by the contact recess Rc can be made uniform.

The embodiment of the present invention has been described above with reference to the drawings. However, the present invention is not limited to the above-described embodiment, and may be implemented in various aspects without departing from the gist thereof. In addition, various aspects may be created by appropriately combining the plurality of components disclosed in the above-described embodiment. For example, some components may be removed from all the components described in the embodiment. Further, components across different configurations may be combined as appropriate. The drawings schematically illustrate each component as a main body in order to make it easier to understand. The thickness, length, number, intervals and the like of illustrated components may differ from the actual ones for the convenience of the drawing. Further, the material, shape, dimensions or the like of each component illustrated in the above embodiment are examples and not particularly limited, and various modifications may be made without substantially deviating from the effects of the present invention.

INDUSTRIAL APPLICABILITY

The present invention is suitably used for semiconductor device forming methods and substrate processing apparatuses.

REFERENCE SIGNS LIST

100 Substrate processing apparatus
110 Chamber
120 Substrate holding section
130 Liquid supply section
132 Processing liquid supply section
134 Removal liquid supply section
136 Water-repellent agent supply section
138 Chemical liquid supply section
W Substrate

The invention claimed is:

1. A semiconductor device forming method, comprising:
forming a coating layer that selectively covers a portion of a recess provided in a stacked structure supported by a base member, the portion of the recess being located on a front surface side of the recess; and
etching a deep portion, which is deeper than the coating layer, of the recess with a chemical liquid so as to widen a diameter of the deep portion of the recess, wherein the forming the coating layer includes:
forming a partially packed bed that fills the deep portion of the recess;
supplying a water-repellent agent after forming the partially packed bed; and
removing the partially packed bed and the water-repellent agent after supplying the water-repellent agent to form the coating layer on the front surface side of the recess.

2. The semiconductor device forming method according to claim 1, wherein the removing the partially packed bed includes supplying a removal liquid to dissolve the partially packed bed.

3. The semiconductor device forming method according to claim 1, wherein:
the partially packed bed contains a substance that sublimes; and
the removing the partially packed bed includes heating the partially packed bed.

4. The semiconductor device forming method according to claim 1, wherein the forming the partially packed bed includes:
forming the packed bed that fills the recess; and
partially removing the packed bed after the packed bed is formed.

5. The semiconductor device forming method according to claim 4, wherein the partially removing the packed bed includes supplying a removal liquid for removing the packed bed.

6. The semiconductor device forming method according to claim 1, wherein the chemical liquid in the etching contains any of hydrofluoric acid, water, and phosphoric acid.

7. The semiconductor device forming method according to claim 1, wherein a plurality of memory cells are formed in the recess.

8. The semiconductor device forming method according to claim 1, wherein:
in the forming the coating layer, the coating layer selectively covers the portion of the recess, which is each of a plurality of recesses, provided in the stacked structure; and
differences between top diameters of the recesses are 5% or less.

9. The semiconductor device forming method according to claim 8, wherein the recesses are regularly arranged in the stacked structure.

10. The semiconductor device forming method according to claim 1, wherein an etch stop layer is arranged between the base member and the stacked structure.

* * * * *